United States Patent
Tanabe

(10) Patent No.: US 11,011,300 B2
(45) Date of Patent: May 18, 2021

(54) ELECTRONIC COMPONENT

(71) Applicant: Murata Manufacturing Co., Ltd., Kyoto-fu (JP)

(72) Inventor: Shimpei Tanabe, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 295 days.

(21) Appl. No.: 16/136,060

(22) Filed: Sep. 19, 2018

(65) Prior Publication Data

US 2019/0096569 A1 Mar. 28, 2019

(30) Foreign Application Priority Data

Sep. 22, 2017 (JP) .............................. JP2017-182594

(51) Int. Cl.
*H01F 27/29* (2006.01)
*H01F 17/00* (2006.01)
(Continued)

(52) U.S. Cl.
CPC ....... *H01F 27/292* (2013.01); *H01F 17/0013* (2013.01); *H01F 41/041* (2013.01);
(Continued)

(58) Field of Classification Search
CPC .... H01F 17/0013; H01F 17/02; H01F 41/041; H05K 1/16; H05K 3/4629;
(Continued)

(56) References Cited

U.S. PATENT DOCUMENTS

2017/0103846 A1* 4/2017 Yoneda ............... H01F 27/2804
2017/0229247 A1 8/2017 Yoneda
(Continued)

FOREIGN PATENT DOCUMENTS

CN 107045648 A 8/2017
JP 2000-348939 A 12/2000
(Continued)

OTHER PUBLICATIONS

An Office Action issued by the State Intellectual Property Office of the People's Republic of China dated Apr. 30, 2020, which corresponds to Chinese Patent Application No. 201811107542.3 and is related to U.S. Appl. No. 16/136,060 with English language translation.

*Primary Examiner* — Matthew V Nguyen
(74) *Attorney, Agent, or Firm* — Studebaker & Brackett PC

(57) ABSTRACT

An electronic component is mounted on a circuit board such that a mounting surface of an element body to which a first outer electrode and a second outer electrode are exposed is directed toward the circuit board. A coil is formed of a spiral coil in which a plurality of coil conductor layers arranged in a direction perpendicular to a first side surface and a second side surface orthogonal to the mounting surface are connected in series. Then, an intermediate point between a lowest point closest to the mounting surface and an uppermost point farthest from the mounting surface in an inner circumference of the coil is offset from the center of the element body in a direction perpendicular to the mounting surface toward the opposite side to the mounting surface.

8 Claims, 15 Drawing Sheets

(51) Int. Cl.
　　　*H01G 4/40*　　　(2006.01)
　　　*H01F 41/04*　　(2006.01)
　　　*H03H 7/01*　　　(2006.01)
　　　*H03H 1/00*　　　(2006.01)

(52) U.S. Cl.
　　　CPC ............. *H01G 4/40* (2013.01); *H03H 7/0115* (2013.01); *H03H 7/1775* (2013.01); *H01F 2017/004* (2013.01); *H01F 2017/0026* (2013.01); *H01F 2017/0073* (2013.01); *H03H 2001/0085* (2013.01)

(58) Field of Classification Search
　　　CPC ......... H05K 2201/09781; H01G 4/005; H01G 4/012; H01G 4/232; H01G 4/30; H01G 4/40
　　　See application file for complete search history.

(56) References Cited

U.S. PATENT DOCUMENTS

| | | | |
|---|---|---|---|
| 2018/0197675 A1* | 7/2018 | Kido | H01F 17/0013 |
| 2019/0164685 A1* | 5/2019 | Hirukawa | H01F 27/32 |
| 2019/0180909 A1* | 6/2019 | Shinohara | H01F 27/2823 |
| 2019/0333686 A1* | 10/2019 | Kazuta | H01F 27/29 |

FOREIGN PATENT DOCUMENTS

| | | |
|---|---|---|
| JP | 2013-098356 A | 5/2013 |
| JP | 2014-179579 A | 9/2014 |
| JP | 2015-039026 A | 2/2015 |
| JP | 2017-143116 A | 8/2017 |

\* cited by examiner

ELECTRONIC COMPONENT

CROSS-REFERENCE TO RELATED APPLICATION

This application claims benefit of priority to Japanese Patent Application No. 2017-182594, filed Sep. 22, 2017, the entire content of which is incorporated herein by reference.

BACKGROUND

Technical Field

The present disclosure relates to electronic components.

Background Art

In general, electronic components are mounted in various electronic devices. As one of the electronic components, for example, a laminated type inductor is known as described, for example, Japanese Unexamined Patent Application Publication No. 2013-98356. Such inductor includes a coil in which a plurality of inner conductor layers are spirally connected and outer electrodes to which both end portions of the coil are connected. The outer electrodes are connected to pads provided on a circuit board of an electronic device, by solder or the like.

With the advent of high-frequency electronic devices such as cellular phones, a small size inductor corresponding to a high frequency signal is required to be provided for such electronic device. Miniaturization of an inductor lowers an inductance value (L value), a Q value, or the like. Therefore, in an inductor used for a high frequency signal, improvement in characteristics such as an inductance value (L value) or a Q value is required.

However, depending on a circuit board on which an electronic component is mounted, a characteristic value (such as an inductance value (L value), Q value, or the like) of the electronic component decreases in some cases. For example, in an electronic component including a spiral coil, magnetic flux generated by the coil is generated in such a manner as to go out from the inside of the coil, pass through the outside of the electronic component, and then return to the inside of the coil. Accordingly, the magnetic flux is blocked by a pad, a ground conductor layer, or the like provided in or on the circuit board. Further, an eddy current due to the magnetic flux is generated in the pad, the ground conductor layer, or the like. Such eddy current may deteriorate the characteristics of the coil. For example, as disclosed in Japanese Unexamined Patent Application Publication No. 2013-98356, in the inductor in which a high Q value is obtained by increasing an inner diameter of the coil, magnetic flux generated by the coil is blocked by the circuit board, and the Q value is likely to decrease.

SUMMARY

The present disclosure thus provides an electronic component capable of suppressing deterioration in characteristics.

An electronic component according to an aspect of the present disclosure includes a first outer electrode and a second outer electrode that have a substantially L shape and are to be connected to a circuit board; and an element body that has a substantially rectangular parallelepiped shape and has a mounting surface to which the first outer electrode and the second outer electrode are exposed, a first end surface which is orthogonal to the mounting surface and to which the first outer electrode is exposed, a second end surface which is parallel to the first end surface and to which the second outer electrode is exposed, and a first side surface and a second side surface that are parallel to each other and are orthogonal to the mounting surface, the first end surface, and the second end surface. The electronic component further includes a coil that has a substantially spiral shape and is provided in the element body where a first end of the coil is connected to the first outer electrode and a second end of the coil is connected to the second outer electrode. The coil includes a plurality of coil conductor layers connected in series and arranged in a first direction perpendicular to the first side surface and the second side surface. Also, in an inner circumference of the coil, an intermediate point between a lowest point closest to the mounting surface and an uppermost point farthest from the mounting surface is offset, that is, shifted from the center of the element body in a second direction perpendicular to the mounting surface toward the opposite side to the mounting surface.

According to this configuration, the electronic component is mounted on the circuit board such that the mounting surface to which the first outer electrode and the second outer electrode are exposed is directed toward the circuit board. The coil is a spiral coil in which a plurality of coil conductor layers arranged in the first direction perpendicular to the first side surface and the second side surface orthogonal to the mounting surface are connected in series. In addition, an intermediate point between the lowest point closest to the mounting surface and the uppermost point farthest from the mounting surface in the inner circumference of the coil is offset, that is, shifted from the center of the element body in the second direction perpendicular to the mounting surface toward the opposite side to the mounting surface. Accordingly, the magnetic flux generated by the coil easily passes between the coil and the mounting surface, i.e., between the coil and the circuit board, and it is hard for the magnetic flux to be blocked by ground wiring, pads, or the like of the circuit board. Therefore, efficiency of obtaining the inductance value (L value) of the coil is improved, and a decrease in the Q value of the coil is suppressed.

In the electronic component described above, it is preferable that the coil have a substantially circular shape when viewed from the first side surface, or a substantially oval shape extending in a direction perpendicular to the first end surface and the second end surface when viewed from the first side surface. According to this configuration, return loss of a high frequency signal is reduced, and the decrease in the Q value of the coil is further suppressed.

It is preferable that the electronic component described above have a capacitor which is connected in parallel to the coil and at least part of which is provided between the coil and the mounting surface. According to this configuration, since the intermediate point of the coil is offset from the center of the element body in the second direction perpendicular to the mounting surface toward the opposite side to the mounting surface, it is possible to provide the electronic component including the coil and the capacitor connected in parallel with each other by forming the capacitor between the coil and the mounting surface while suppressing a decrease in the Q value of the coil. Further, a surplus area around the coil can be used for the capacitor, so that a reduction in a mounting area and a reduction in size of the electronic component including the coil and the capacitor can be achieved.

In the electronic component described above, it is preferable that the capacitor include a plurality of capacitor conductor layers arranged in the first direction and opposing each other in the first direction. According to this configuration, by adjusting the number of capacitor conductor layers, an acquisition range of capacitance of the capacitor is widened. Further, since a pattern of the coil and a pattern of the capacitor can be formed in the same process, the manufacturing efficiency is improved.

In the electronic component described above, it is preferable that the coil have a substantially circular shape when viewed from the first side surface. According to this configuration, it is possible to reduce the return loss of the high frequency signal and to further suppress the decrease in the Q value of the coil.

In the electronic component described above, it is preferable that the capacitor have a first capacitance portion provided between the coil and the mounting surface, a second capacitance portion provided between the coil and the first end surface, and a third capacitance portion provided between the coil and the second end surface. According to this configuration, an opposing area of the capacitor can be increased, so that the acquisition range of the capacitance of the capacitor widens.

In the electronic component described above, it is preferable that the coil have a substantially oval shape extending in a direction perpendicular to the first end surface and the second end surface when viewed from the first side surface. According to this configuration, it is possible to reduce the return loss of the high frequency signal and to further suppress the decrease in the Q value of the coil.

In the electronic component described above, it is preferable that the capacitor have a substantially rectangular shape extending in the direction perpendicular to the first end surface and the second end surface when viewed from the first side surface. According to this configuration, the inductance value (L value) can be increased by increasing the length of the coil, and the range of acquisition of the inductance value can be widened. Further, it is possible to increase the Q value by increasing the area inside the coil, and to widen the range of acquisition of the Q value. Furthermore, in the magnetic flux generated by the coil, an amount of magnetic flux blocked by the capacitor conductor layer is reduced, whereby the decrease in the Q value of the coil can be further suppressed.

In the electronic component described above, it is preferable for each of the first outer electrode and the second outer electrode to have an outer terminal electrode embedded in the element body. According to this configuration, it is possible to reduce the size of the electronic component in comparison with a case where the outer electrode is externally attached to the element body. In addition, a positional shift between the first and second outer electrodes and a pattern inside the element body (i.e., a pattern of the coil) is unlikely to occur, so that a variation in the characteristics is reduced.

In the electronic component described above, it is preferable that the intermediate point be located on a side opposite to the mounting surface relative to an upper end of each of the first outer electrode and the second outer electrode. According to this configuration, the magnetic flux generated by the coil is hard to be blocked by the first outer electrode and the second outer electrode, and stray capacitance generated between the coil and the first and second outer electrodes is reduced. Thus, the decrease in the Q value of the coil is further suppressed.

In the electronic component described above, it is preferable that the capacitor be located closer to the mounting surface side than to the upper ends of the first outer electrode and the second outer electrode. According to this configuration, it is possible to improve the efficiency of obtaining the capacitance value of the capacitor due to stray capacitance generated between the first and second outer electrodes and the capacitor conductor layer.

In the electronic component described above, in a case where a dimension of the element body in a direction perpendicular to the mounting surface is taken as a height dimension T1 and a distance from the mounting surface to the intermediate point is taken as a height D1, it is preferable that a ratio D1/T1, which is a ratio of the height D1 to the height dimension T1, satisfy a range of $0.51 \leq D1/T1 \leq 0.71$. According to this configuration, the magnetic flux generated by the coil is hard to be blocked, and the decrease in the Q value of the coil is further suppressed.

Other features, elements, characteristics and advantages of the present disclosure will become more apparent from the following detailed description of preferred embodiments of the present disclosure with reference to the attached drawings.

DETAILED DESCRIPTION

Hereinafter, each embodiment will be described.

In the accompanying drawings, constituent elements are enlarged and illustrated in some cases in order to facilitate the understanding. The dimensional ratio of the constituent elements may be different from the actual ratio or the ratio in other drawings. In addition, in a perspective view or the like, in order to facilitate the understanding, some of the constituent elements may be given pearskin hatching in some cases.

First Embodiment

Hereinafter, a first embodiment will be described.

Figure 1:
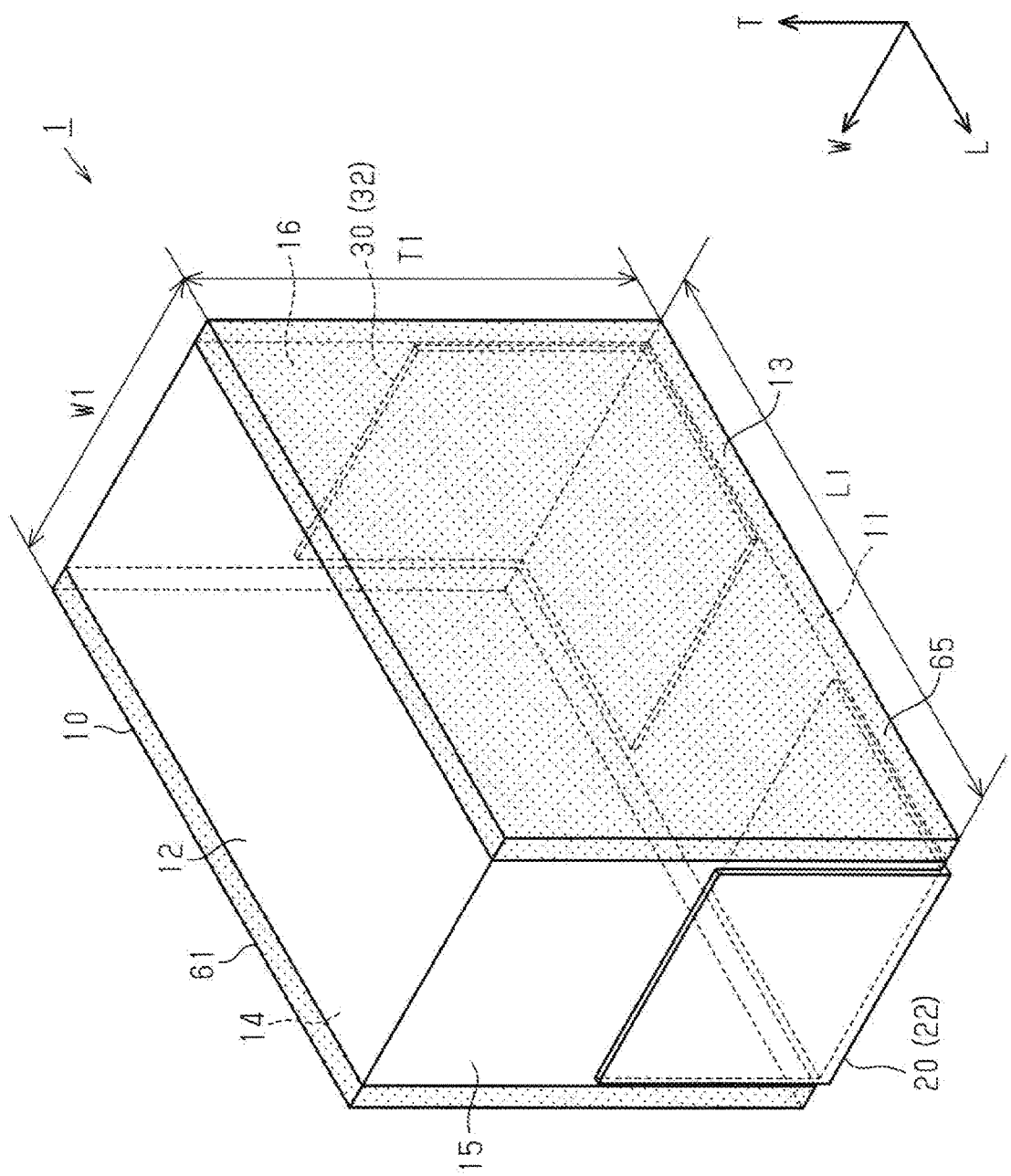
FIG. 1 is a schematic perspective view of an electronic component according to a first embodiment.

As illustrated in FIG. 1, an electronic component 1 includes an element body 10. The element body 10 is formed in a generally rectangular parallelepiped shape. In this specification, the term "rectangular parallelepiped shape" includes a rectangular parallelepiped in which a corner portion, a ridge portion and the like are chamfered, a rectangular parallelepiped in which a corner portion, a ridge portion and the like are rounded, or the like. In addition, irregularities or the like may be formed on some or all of the main surfaces and side surfaces. In addition, in a "rectangular parallelepiped shape", it is not absolutely necessary that the opposing surfaces be completely parallel to each other, and there may be some inclination.

The element body 10 has a mounting surface 11. This mounting surface 11 means a surface opposing the circuit board when the electronic component 1 is mounted on the stated circuit board. The element body 10 has an upper surface 12 parallel to the mounting surface 11. Further, the element body 10 has two pairs of surfaces orthogonal to the mounting surface 11. One of the two pairs of surfaces is defined as a first side surface 13 and a second side surface 14, and the other one of the two pairs of surfaces is defined as a first end surface 15 and a second end surface 16.

In this specification, a direction perpendicular to the upper surface 12 and the mounting surface 11 is defined as a "height direction", a direction perpendicular to the first side surface 13 and the second side surface 14 is defined as a "width direction", and a direction perpendicular to the first end surface 15 and the second end surface 16 is defined as a "lengthwise direction". As a specific example, a "lengthwise direction L", a "height direction T", and a "width direction W" are illustrated in FIG. 1. In addition, a size in the "width direction" is defined as a "width dimension", a size in the "height direction" is defined as a "height dimension", and a size in the "lengthwise direction" is defined as a "length dimension".

In the element body 10, it is preferable that the size in the lengthwise direction L (length dimension L1) be larger than about 0 mm and equal to or smaller than about 1.0 mm (i.e., from larger than about 0 mm to about 1.0 mm). For example, the length dimension L1 is about 0.6 mm. In addition, in the element body 10, it is preferable that the size in the width direction W (width dimension W1) be larger than about 0 mm and equal to or smaller than about 0.6 mm (i.e., from larger than about 0 mm to about 0.6 mm). It is preferable for the width dimension W1 to be equal to or smaller than about 0.36 mm, and more preferable to be equal to or smaller than about 0.33 mm. For example, the width dimension W1 of the element body 10 is about 0.3 mm. In addition, in the element body 10, it is preferable that the size in the height direction T (height dimension T1) be equal to or greater than about 0 mm and equal to or smaller than about 0.8 mm (i.e., from larger than about 0 mm to about 0.8 mm). For example, the height dimension T1 of the element body 10 is about 0.4 mm. In this embodiment, the height dimension T1 of the element body 10 is greater than the width dimension W1 thereof (T1>W1).

Figure 2A:
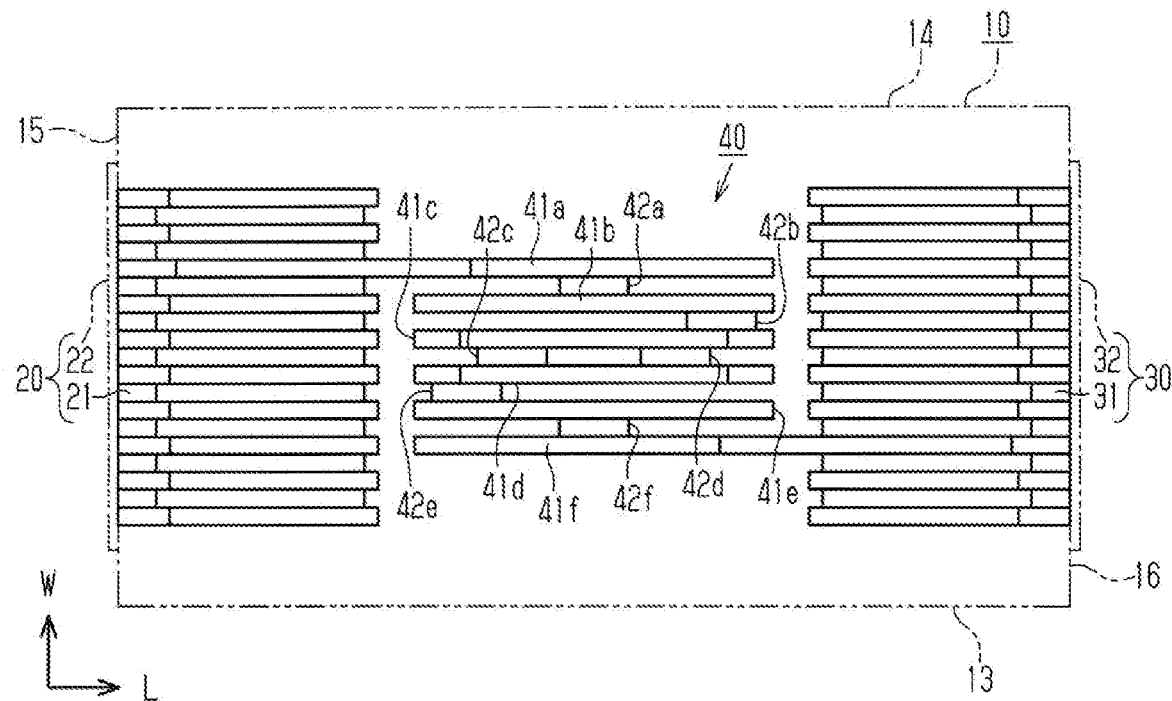
FIG. 2A is a schematic plan view of the electronic component according to the first embodiment.
Figure 2B:
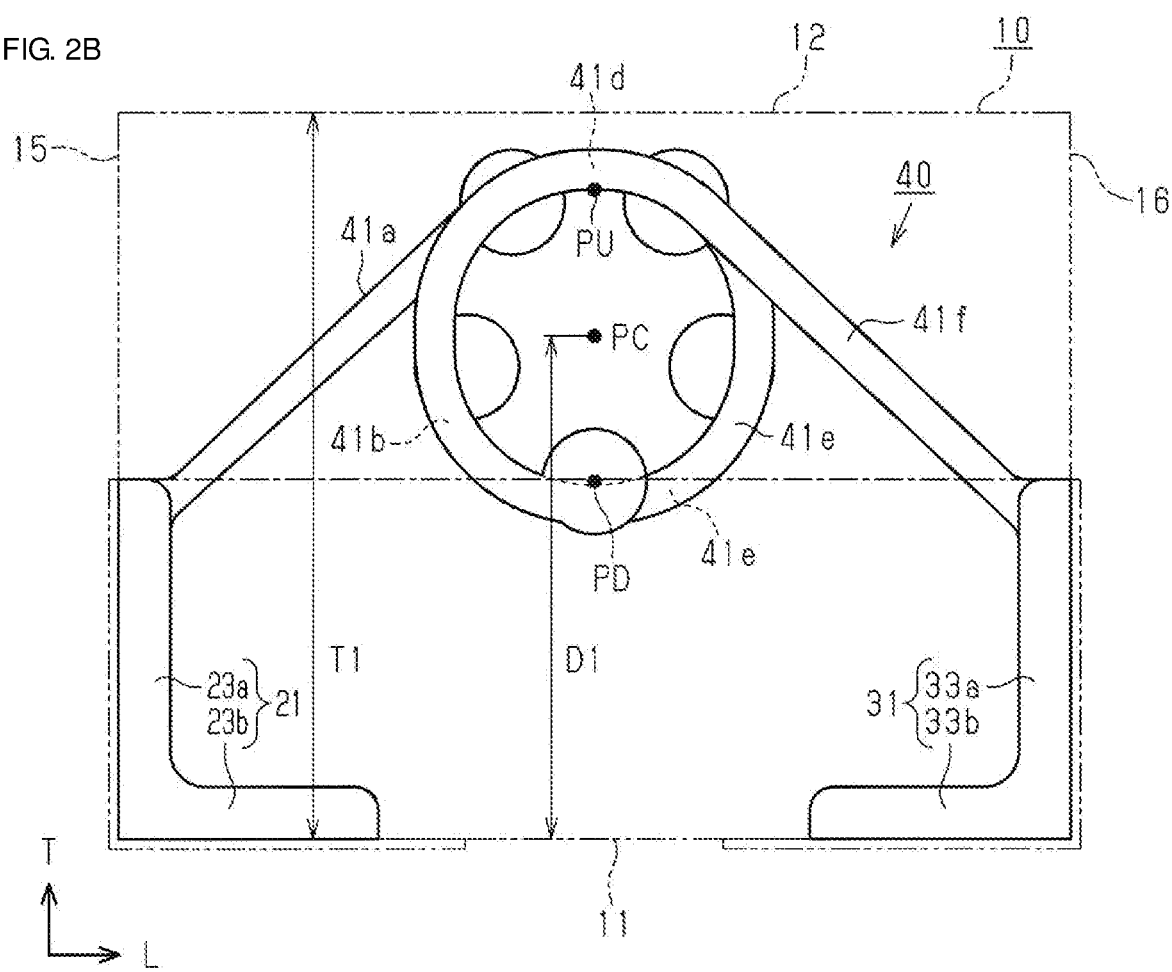
FIG. 2B is a schematic front view of the electronic component according to the first embodiment.
Figure 3:
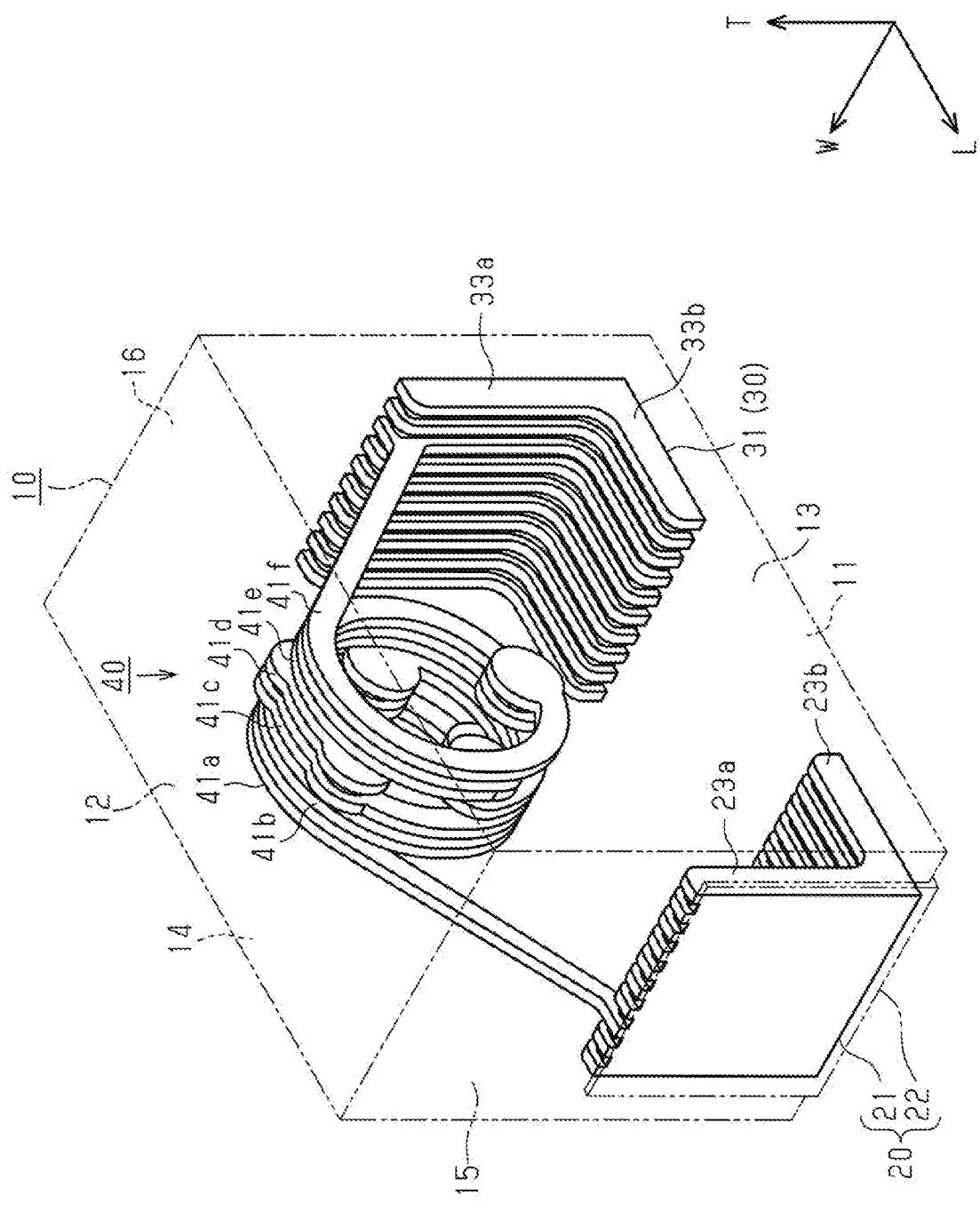
FIG. 3 is a schematic perspective view of the electronic component according to the first embodiment.

As illustrated in FIG. 2A, FIG. 2B, and FIG. 3, the electronic component 1 includes a first outer electrode 20, a second outer electrode 30, and a coil 40. In FIGS. 2A, 2B, and 3, the coil 40 and outer terminal electrodes 21, 31 of the first outer electrode 20 and the second outer electrode 30, which will be described later, are indicated by solid lines, and the members such as the element body 10 are indicated by double-dot dash lines, so that the coil 40 and the outer terminal electrodes 21, 31 can be easily recognized.

The first outer electrode 20 is exposed to the mounting surface 11 of the element body 10. Further, the first outer electrode 20 is exposed to the first end surface 15 of the element body 10.

Similarly, the second outer electrode 30 is exposed to the mounting surface 11 of the element body 10. Further, the second outer electrode 30 is exposed to the second end surface 16 of the element body 10.

In other words, the first outer electrode 20 and the second outer electrode 30 are exposed to the mounting surface 11 of the element body 10. To rephrase, in the element body 10, the surface where the first outer electrode 20 and the second outer electrode 30 are exposed is taken as the mounting surface 11.

In this embodiment, the first outer electrode 20 includes the outer terminal electrode 21 and a covering layer 22. The outer terminal electrode 21 is embedded in the element body 10. The outer terminal electrode 21 is formed in a substantially L shape when viewed from the width direction. The outer terminal electrode 21 includes an end surface electrode 23a exposed to the second end surface 16 of the element body 10 and a lower surface electrode 23b exposed to the mounting surface 11 of the element body 10. The covering layer 22 is formed so as to cover the outer terminal electrode 21 exposed to the first end surface 15 and the mounting surface 11 of the element body 10. Accordingly, the first outer electrode 20 is exposed continuously from the mounting surface 11 reaching the halfway of the first end surface 15 in the element body 10.

In this embodiment, the second outer electrode 30 includes the outer terminal electrode 31 and a covering layer 32. The outer terminal electrode 31 is embedded in the element body 10. The outer terminal electrode 31 is formed in a substantially L shape. The outer terminal electrode 31 includes an end surface electrode 33a exposed to the second end surface 16 of the element body 10 and a lower surface electrode 33b exposed to the mounting surface 11 of the element body 10. The covering layer 32 is formed so as to cover the outer terminal electrode 31 exposed to the second end surface 16 and the mounting surface 11 of the element body 10. Accordingly, the second outer electrode 30 is exposed continuously from the mounting surface 11 reaching the halfway of the second end surface 16 in the element body 10.

As a material of the covering layer 22 and the covering layer 32, a material having high solder resistance, high solder wettability, and the like can be used. For example, a metal such as nickel (Ni), copper (Cu), tin (Sn) or gold (Au), an alloy containing these metals, or the like can be used. Further, the covering layer can be formed of a plurality of layers. For example, Ni plating and Sn plating covering the surface of Ni plating can be used. Note that the covering layer 22 and the covering layer 32 may be omitted. In this case, the outer terminal electrode 21 can be made to be the first outer electrode 20 and the outer terminal electrode 31 can be made to be the second outer electrode 30.

The first outer electrode 20 is formed, on the first end surface 15, extending upward from the mounting surface 11 of the element body 10 to have a length equivalent to approximately half the height of the element body 10. The first outer electrode 20 is formed substantially at the center of the element body 10 in the width direction W. In this embodiment, the size of the first outer electrode 20 in the width direction W (width dimension) is smaller than the width dimension of the element body 10. Note that the width dimension of the first outer electrode 20 may be changed as appropriate, and may be formed across the entirety in the width direction of the element body 10, for example.

The second outer electrode 30 is formed, on the second end surface 16, extending upward from the mounting surface 11 of the element body 10 to have a length equivalent to approximately half the height of the element body 10. The second outer electrode 30 is formed substantially at the center of the element body 10 in the width direction W. In this embodiment, the size of the second outer electrode 30 in the width direction W (width dimension) is smaller than the width dimension of the element body 10. Note that the width dimension of the second outer electrode 30 may be changed as appropriate, and may be formed across the entirety in the width direction of the element body 10, for example.

Figure 4:
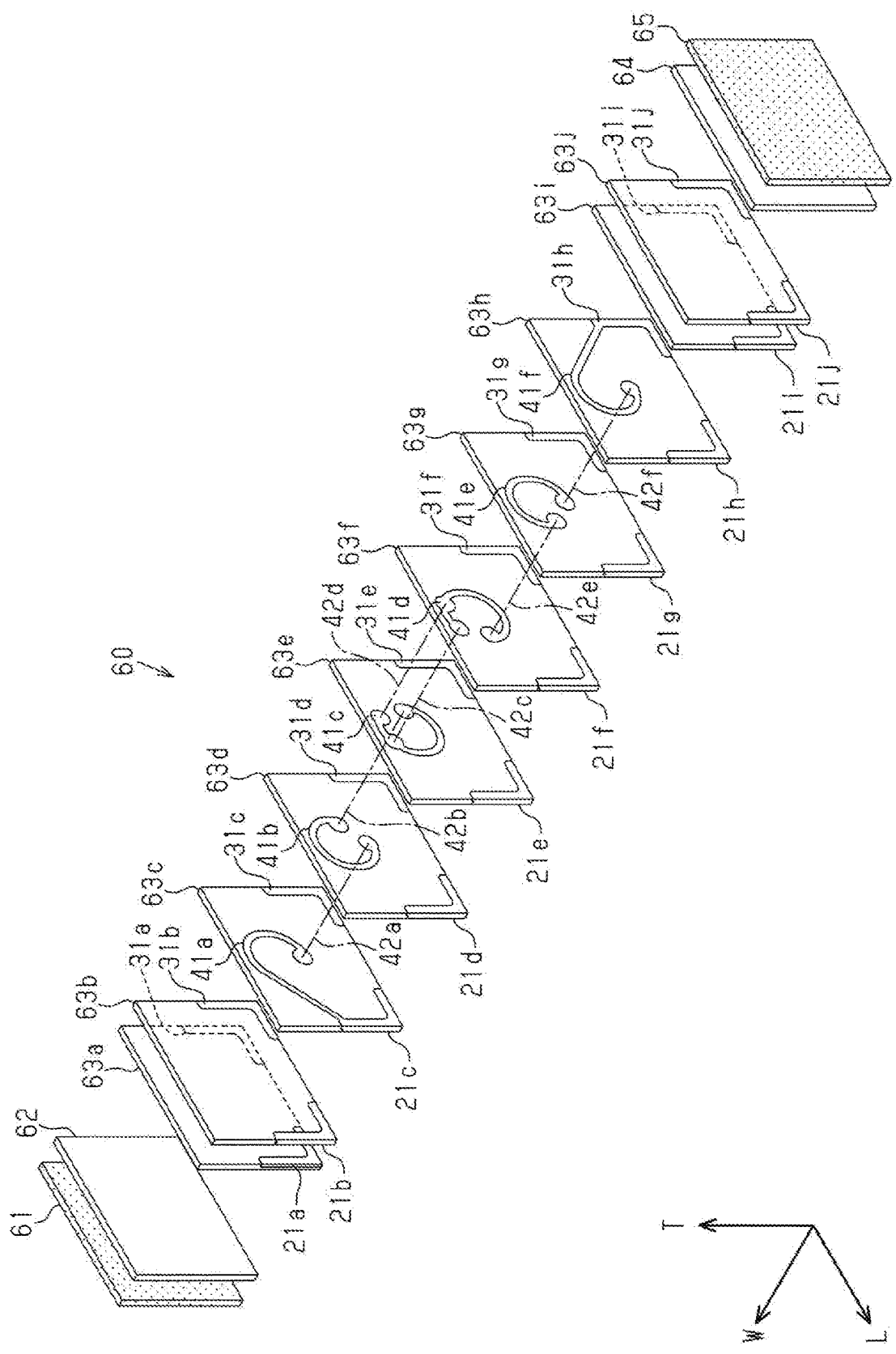
FIG. 4 is an exploded perspective view of the electronic component according to the first embodiment.

As illustrated in FIG. 4, the element body 10 includes a plurality of insulator layers 60. The element body 10 is formed by laminating the plurality of insulator layers 60. The insulator layers are assigned reference signs "61, 62, 63a to 63j, 64, and 65", respectively, for being distinguished from one another. In the following description, a reference sign "60" is used when the plurality of insulator layers are not distinguished, and the reference signs "61, 62, 63a to 63j, 64, and 65" are used when each of the insulator layers is distinguished from each other.

The plurality of insulator layers 60 are each formed in a substantially rectangular plate shape. The element body 10 has a substantially rectangular parallelepiped shape by these laminated insulator layers 60. As a material of the insulator layer 60, a material having a relative permeability of about "2" (two) or less can be used. It is preferable that the relative permeability of the insulator layer 60 be close to about "1" (one). The insulator layer 60 is made of, for example, an insulating material containing borosilicate glass as a main ingredient, or a material such as alumina, zirconia or an insulating resin like a polyimide resin. Note that there is a case where interfaces between the plurality of insulator layers 60 are not clear in the element body 10 due to a process such as firing or curing.

The color of the insulator layers 61, 65 is different from that of the other insulator layers 62, 63a to 63j, and 64. In FIG. 1, the insulator layers 61, 65 are illustrated being distinguished from the other insulator layers by use of hatching and solid lines. With this, at a time of mounting the electronic component 1, it is possible to detect falling on its side or the like of the electronic component 1.

The coil 40 is provided inside the element body 10. A first end of the coil 40 is connected to the first outer electrode 20, and a second end of the coil 40 is connected to the second outer electrode 30.

As illustrated in FIG. 2A, the coil 40 includes a plurality of coil conductor layers 41a to 41f provided in the width direction W of the element body 10, and via conductor layers 42a to 42f for connecting the coil conductor layers 41a to 41f. As illustrated in FIG. 2B, the coil conductor layers 41a to 41f partially overlap with each other to form a substantially circular path when viewed from the width direction W (a direction perpendicular to the first side surface 13 and the second side surface 14 illustrated in FIG. 1 and a lamination direction of the insulator layers). Accordingly, the coil 40 is formed in a substantially circular shape when viewed from the width direction W. Note that "to overlap with each other" includes a case where the coil conductor layers do not fully overlap with each other due to manufacturing variations or the like. The shape of the coil 40 is not limited to the above shape, and the outer shape thereof may be, for example, a substantially oval shape, a substantially rectangular shape, another kind of polygonal shape, a combination of a plurality of shapes, or the like.

In the coil 40 of the present embodiment, a lowest point in the inner circumference of the coil 40, that is, a point close to the mounting surface 11 is defined as a lowest point PD. Further, a highest point in the inner circumference of the coil 40, that is, a point farthest from the mounting surface 11 is defined as an uppermost point PU. The inner circumference of the coil 40 indicates an inner-side side of the coil 40, in the plurality of coil conductor layers 41a to 41f forming the coil 40. In FIG. 2B, inner-side sides of the coil conductor layers 41c and 41d (see FIG. 4) overlapping with the coil conductor layer 41f are indicated by a broken line. Then, an intermediate point between the lowest point PD and the uppermost point PU is defined as an intermediate point PC of the coil 40. In this embodiment, the intermediate point PC of the coil 40 is located above the center of the element body 10 in the height direction T. In other words, the intermediate point PC of the coil 40 is offset, in other words, shifted above the center of the element body 10.

Assume that the height dimension of the element body 10 is T1 and the height of the intermediate point PC of the coil 40 is D1. It is preferable that a ratio D1/T1, which is a ratio of the height D1 to the height dimension T1, satisfy a relation of $0.51 \leq D1/T1 \leq 0.71$, for example. When the ratio D1/T1 is equal to or larger than about 0.51, magnetic flux generated by the coil 40 is hard to be blocked by the circuit board. When the ratio D1/T1 is equal to or smaller than about 0.71, it is easy to secure an inner diameter of the coil 40, and a decrease in the Q value of the coil 40 can be further suppressed.

In the present embodiment, the first outer electrode 20 and the second outer electrode 30 are located such that the upper ends thereof are at a height equivalent to about half the height dimension of the element body 10 in the height direction T of the element body 10. Accordingly, in this embodiment, the intermediate point PC of the coil 40 is located above the upper end of the first outer electrode 20 and the upper end of the second outer electrode 30 (the opposite side to the mounting surface 11 of the element body 10).

The coil 40 (the coil conductor layers 41a to 41f and the via conductor layers 42a to 42f) is made of a conductive material such as a metal with low electric resistance like silver (Ag), copper (Cu) or gold (Au), or an alloy mainly containing these metals, for example.

As illustrated in FIG. 4, the coil conductor layers 41a to 41f are formed in a substantially planar shape on the insulator layers 63c to 63h, respectively. The coil conductor layers 41a to 41f are electrically connected in series via the via conductor layers 42a to 42f (see FIG. 4) passing through the insulator layers 63d to 63h in a thickness direction thereof. In FIG. 4, each of the via conductor layers 42a to 42f is indicated by a dot-dash line. Thus, the plurality of coil conductor layers 41a to 41f are electrically connected in series to each other and constitute a spiral. As such, the coil 40 is a spiral coil constituted by connecting the coil conductor layers 41a to 41f, the winding number (the number of turns) of each of which is less than one, with the via conductor layers 42a to 42f in series. Note that the coil conductor layers 41a to 41f are only required to be connected in series between the first outer electrode 20 and the second outer electrode 30 as a whole. For example, even if portions that are connected in parallel, like the coil conductor layers 41c and 41d, are partly included, the coil conductor layers can be said to be connected in series in a view of a path from an end portion of the coil conductor layer 41c connected with the coil conductor layer 41b to an end portion of the coil conductor layer 41d connected with the coil conductor layer 41e. Accordingly, the coil 40 is a coil in which the plurality of coil conductor layers 41a to 41f are connected in series.

On the insulator layers 63a to 63j, outer conductor layers 21a to 21j constituting the outer terminal electrode 21 illustrated in FIG. 2B and outer conductor layers 31a to 31j constituting the outer terminal electrode 31 are formed. The outer conductor layers 21a to 21j are formed in a substantially L shape and are provided in a corner portion of each of the insulator layers 63a to 63j. Further, the outer conductor layers 31a to 31j are formed in a substantially L shape and are provided in a corner portion of each of the insulator layers 63a to 63j so as to be symmetrical with the outer conductor layers 21a to 21j.

The outer terminal electrode 21 is formed of the outer conductor layers 21a to 21j by laminating the insulator layers 63a to 63j. The outer terminal electrode 31 is formed of the outer conductor layers 31a to 31j by laminating the insulator layers 63a to 63j.

More specifically, the outer conductor layers 21a and 31a are conductor layers formed on the main surface of the insulator layer 63a. The outer conductor layers 21b to 21j and 31b to 31j respectively include conductor layers formed on the main surface of each of the insulator layers 63b to 63j and connecting portions passing through each of the insulator layers 63b to 63j. FIG. 2A illustrates a state in which the conductor layers and the connecting portions are alternately provided in the width direction W. By laminating the insulator layers 63a to 63j, the outer conductor layers 21a to 21j are connected to each other to form the outer terminal electrode 21, and the outer conductor layers 31a to 31j are connected to each other to form the outer terminal electrode 31.

The outer terminal electrode 21 (the outer conductor layers 21a to 21j) is made of a conductive material such as a metal with low electric resistance like silver (Ag), copper (Cu) or gold (Au), or an alloy containing these metals as a main ingredient, for example. The outer terminal electrode 31 (the outer conductor layers 31a to 31j) is formed of a conductive material such as a metal with low electric resistance like silver (Ag), copper (Cu) or gold (Au), or an alloy containing these metals as a main ingredient, for example.

Manufacturing Method

Next, a method for manufacturing the electronic component 1 described above will be described with reference to FIG. 4.

First, a mother insulator layer to be the insulator layer 61 is formed. The mother insulator layer is a large-size insulator layer in which the plurality of insulator layers 61 are arranged in a matrix form in a state of being connected with each other. For example, an insulating paste containing borosilicate glass as a main ingredient is applied on a carrier film by screen printing, and then the entire insulating paste is exposed to ultraviolet rays. Thus, the insulating paste is cured so as to form the mother insulator layer to be the insulator layer 61. In this embodiment, an insulating paste having a relative permeability of about "2" (two) or less after firing, is used. Note that the insulating paste used for the insulator layer 61 is colored differently from the insulating paste used for the insulator layers 62, 63a to 63j, and 64.

Next, a mother insulator layer to be the insulator layer 62 is formed. After applying an insulating paste on the mother insulator layer to be the insulator layer 61 by screen printing, the entire insulating paste is exposed to ultraviolet rays so as to form the mother insulator layer to be the insulator layer 62.

Next, a mother insulator layer to be the insulator layer 63a is formed. After the insulating paste is applied on the mother insulator layer to be the insulator layer 62, the entire insulating paste is exposed to ultraviolet rays so as to form the mother insulator layer to be the insulator layer 63a.

Next, the outer conductor layers 21a and 31a are formed by a photolithography process. For example, a photosensitive conductive paste containing Ag as a main ingredient of metal is applied on the mother insulator layer to be the insulator layer 63a by printing to form a conductive paste layer. Subsequently, the conductive paste layer is irradiated with ultraviolet rays or the like through a photomask, and is developed with an alkali solution or the like. Thus, the outer conductor layers 21a and 31a are formed on the mother insulator layer to be the insulator layer 63a.

Next, a mother insulator layer to be the insulator layer 63b is formed. After the insulating paste is applied on the mother insulator layer to be the insulator layer 63a, the insulating paste is exposed to ultraviolet rays through a photomask covering the positions where the outer conductor layers 21b and 31b are formed. Subsequently, the uncured insulating paste is removed using an alkali solution or the like. With this, the mother insulator layer to be the insulator layer 63b is formed, in which corner portions corresponding to the outer conductor layers 21b and 31b are cut out.

Next, the outer conductor layers 21b and 31b are formed by a photolithography process. For example, a photosensitive conductive paste containing Ag as a main ingredient of metal is applied on the mother insulator layer to be the insulator layer 63b by printing to form a conductive paste layer. At this time, the conductive paste fills the above-mentioned cutout portion. Subsequently, the conductive paste layer is irradiated with ultraviolet rays or the like through a photomask, and is developed with an alkali solution or the like. Thus, the outer conductor layers 21b and 31b are formed on the mother insulator layer to be the insulator layer 63b.

Next, a mother insulator layer to be the insulator layer 63c is formed. After the insulating paste is applied on the mother insulator layer to be the insulator layer 63b, the insulating paste is exposed to ultraviolet rays through a photomask covering the positions where the outer conductor layers 21c and 31c are formed. Subsequently, the uncured insulating paste is removed using an alkali solution or the like. As a result, the mother insulator layer to be the insulator layer 63c is formed, in which corner portions corresponding to the outer conductor layers 21c and 31c are cut out.

Next, the coil conductor layer 41a and the outer conductor layers 21c and 31c are formed by a photolithography process. A photosensitive conductive paste containing Ag as a main ingredient of metal is applied on the mother insulator layer to be the insulator layer 63c by printing to form a conductive paste layer. At this time, the conductive paste fills the above-mentioned cutout portion. Subsequently, the conductive paste layer is irradiated with ultraviolet rays or the like through a photomask, and is developed with an alkali solution or the like. As a result, the coil conductor layer 41a and the outer conductor layers 21c and 31c are formed on the mother insulator layer to be the insulator layer 63c.

Next, a mother insulator layer to be the insulator layer 63d is formed. After the insulating paste is applied on the mother insulator layer to be the insulator layer 63c, the insulating paste is exposed to ultraviolet rays through a photomask covering the positions where the via conductor layer 42a and the outer conductor layers 21d, 31d are formed. Subsequently, the uncured insulating paste is removed using an alkali solution or the like. As a result, the mother insulator layer to be the insulator layer 63d is formed, in which a through-hole is provided at a position corresponding to the via conductor layer 42a, and corner portions corresponding to the outer conductor layers 21d and 31d are cut out.

Next, the coil conductor layer 41b, the via conductor layer 42a, and the outer conductor layers 21d, 31d are formed by a photolithography process. A photosensitive conductive paste containing Ag as a main ingredient of metal is applied on the mother insulator layer to be the insulator layer 63d by printing to form a conductive paste layer. At this time, the conductive paste fills the through-hole and cutout portion described above. Subsequently, the conductive paste layer is irradiated with ultraviolet rays or the like through a photomask, and is developed with an alkali solution or the like. Thus, the coil conductor layer 41b, the via conductor layer 42a, and the outer conductor layers 21d, 31d are formed on the mother insulator layer to be the insulator layer 63d.

Thereafter, the process of forming a mother insulator layer and the photolithography process are alternately repeated so as to form mother insulator layers to be the insulator layers 63e to 63h, the coil conductor layers 41c to 41f, the outer conductor layers 21e to 21h and 31e to 31h, and the via conductor layers 42b to 42f.

Further, mother insulator layers to be the insulator layers 63i and 63j as well as the outer conductor layers 21i, 21j, 31i and 31j, are formed by alternately repeating the process of forming a mother insulator layer and the photolithography process.

Next, a mother insulator layer to be the insulator layer 64 is formed on the mother insulator layer to be the insulator layer 63j in the same manner as the mother insulator layer to be the insulator layer 62 discussed above. Then, a mother insulator layer to be the insulator layer 65 is formed on the mother insulator layer to be the insulator layer 64 in the same manner as the mother insulator layer to be the insulator layer 61 described above.

A mother multilayer body including a plurality of element bodies 10 arranged in a matrix form and connected with each other, is obtained through the above processes.

Next, the mother multilayer body is cut with a dicing machine or the like to obtain un-fired element bodies 10. During the cutting process, the outer conductor layers 21a to 21j and 31a to 31j are exposed from the element bodies 10 on cut surfaces formed by the cutting. Note that, since the element body 10 shrinks during firing to be described later, the mother multilayer body is cut in consideration of the shrinkage.

Next, the un-fired element body 10 is fired under a predetermined condition to obtain the element body 10. Further, barrel finishing is performed on the element body 10. Subsequently, the covering layers 22, 32 (see FIG. 1) for covering the outer conductor layers 21a to 21j and 31a to 31j are formed. For example, the covering layer can be formed by an electrolytic plating method, an electroless plating method, or the like.

The electronic component 1 is completed through the processes discussed above.

Note that the above-discussed manufacturing method is merely an example, and any other known manufacturing method may be substituted for the above method or may be added as long as the structure of the electronic component 1 can be realized. For example, mother insulator layers to be the respective insulator layers are formed on a carrier film, and coil conductor layers and the like are formed on required mother insulator layers. A plurality of mother insulator layers may be laminated to obtain the mother multilayer body described above. Further, the coil conductor layers and the like may be formed by another method such as a printing method.

Action

Next, the action of the electronic component 1 will be described.

The electronic component 1 is mounted in such a manner that the mounting surface 11 of the element body 10 to which the first outer electrode 20 and the second outer electrode 30 are exposed is directed toward the circuit board. The coil 40 is a spiral coil in which the plurality of coil conductor layers 41a to 41f arranged in the direction perpendicular to the first side surface 13 and the second side surface 14 orthogonal to the mounting surface 11 are connected in series. Then, the intermediate point PC between the lowermost point PD closest to the mounting surface 11 and the uppermost point PU farthest from the mounting surface 11 in the inner circumference of the coil 40 is offset from the center of the element body 10 in the direction perpendicular to the mounting surface 11 toward the opposite side to the mounting surface 11. Accordingly, the magnetic flux generated by the coil 40 easily passes between the coil 40 and the mounting surface 11, i.e., between the coil 40 and the circuit board, and it is hard for the magnetic flux to be blocked by the ground wiring, pads, or the like of the circuit board. Therefore, the efficiency of obtaining the inductance value (L value) of the coil 40 is improved, and the decrease in the Q value of the coil 40 is suppressed.

Here, a comparative example will be described.

Figure 5:
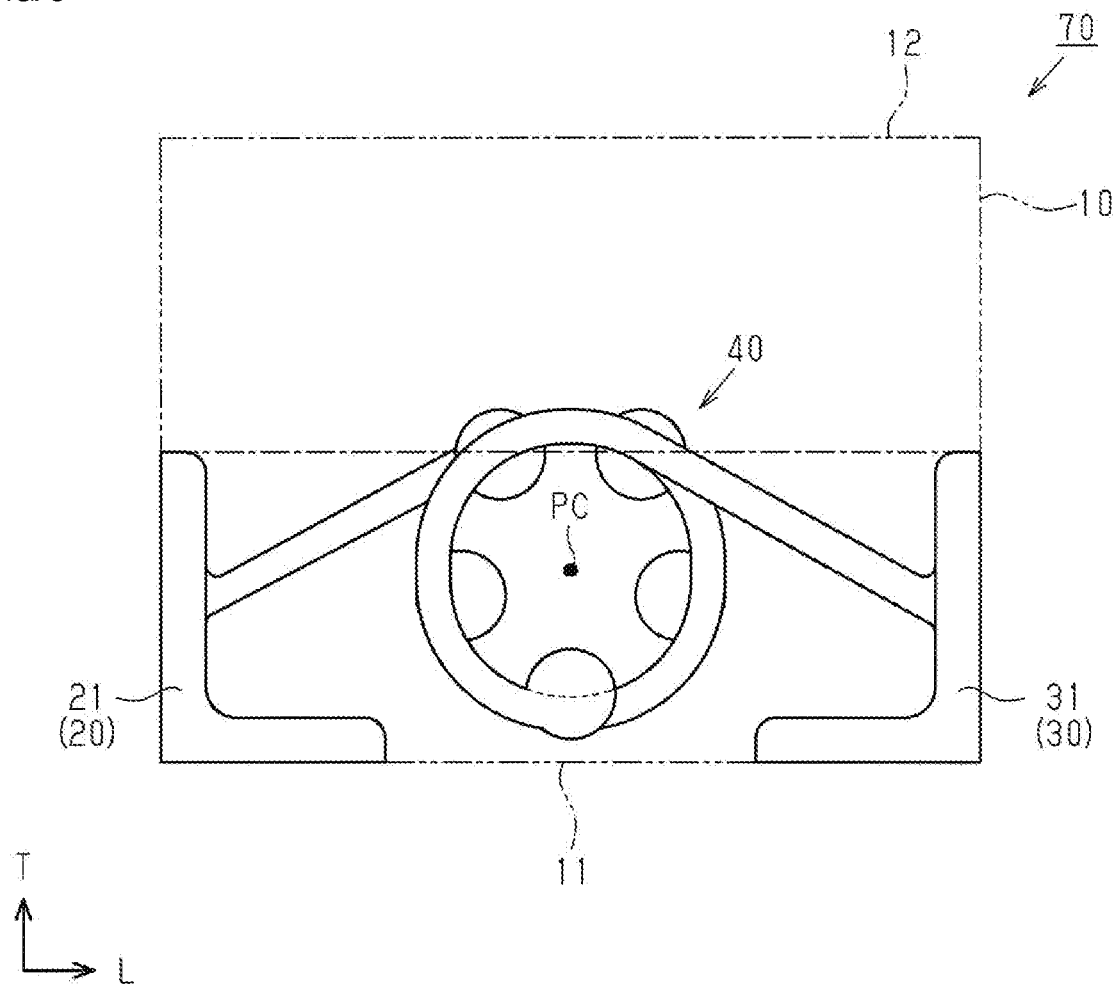
FIG. 5 is a schematic front view of an electronic component according to a comparative example.

FIG. 5 illustrates an electronic component 70 of a comparative example. In this electronic component 70, the position of a coil 40 is changed compared to that in the electronic component 1 discussed above. In the electronic component 70 of this comparative example, an intermediate point PC of the coil 40 is lower than a height equivalent to about half a height dimension T1 of an element body 10. An inductance value (L value) of the electronic component 70 is about 2.6 nH in a case of an input signal at a frequency of about 500 MHz. Further, a Q value of this electronic component 70 is about 8.0 in a case of an input signal at a frequency of about 500 MHz. Further, a self-resonant frequency of the coil 40 is about 16.2 GHz.

An inductance value (L value) of the electronic component 1 of the present embodiment is about 2.7 nH in a case of an input signal at a frequency of about 500 MHz. Further, a Q value of this electronic component 1 is about 12.0 in a case of an input signal at a frequency of about 500 MHz. In the electronic component 1 of the present embodiment, a self-resonant frequency of the coil 40 is about 16.4 GHz. Accordingly, as in this embodiment, by increasing the height of the intermediate point PC of the coil 40, it is possible to suppress a decrease in the Q value.

As described above, according to the present embodiment, the following effects can be obtained.

(1-1) The electronic component 1 is mounted in such a manner that the mounting surface 11 of the element body 10 to which the first outer electrode 20 and the second outer electrode 30 are exposed is directed toward the circuit board. The coil 40 is formed of a spiral coil in which the plurality of coil conductor layers 41a to 41f arranged in the direction perpendicular to the first side surface 13 and the second side surface 14 orthogonal to the mounting surface 11 are connected in series. Then, the intermediate point PC between the lowest point PD closest to the mounting surface 11 and the uppermost point PU farthest from the mounting surface 11 in the inner circumference of the coil 40 is offset from the center of the element body 10 in the direction perpendicular to the mounting surface 11 toward the opposite side to the mounting surface 11. Accordingly, the magnetic flux generated by the coil 40 easily passes between the coil 40 and the mounting surface 11, i.e., between the coil 40 and the circuit board, and it is hard for the magnetic flux to be blocked by the ground wiring, pads, or the like of the circuit board. Because of this, the efficiency of obtaining the inductance value (L value) of the coil 40 is improved, and it is possible to suppress the decrease in the Q value of the coil 40.

(1-2) The intermediate point PC of the coil 40 is located above the upper ends of the first outer electrode 20 and the second outer electrode 30. Accordingly, the magnetic flux generated by the coil 40 is unlikely to be blocked by the first outer electrode 20 and the second outer electrode 30. Therefore, since the stray capacitance generated between the coil 40 and the first and second outer electrodes 20, 30 is reduced, the decrease in the Q value of the coil 40 can be further suppressed.

(1-3) The first outer electrode 20 and the second outer electrode 30 are each formed in a substantially L shape and embedded in the element body 10. Accordingly, it is possible to reduce the size of the electronic component 1 in comparison with the case where the outer electrode is externally attached to the component main body. Then, it is possible to improve the efficiency of obtaining the inductance value with respect to the mounting area of the electronic component 1.

(1-4) The coil 40 is substantially circular in shape. In a coil including a bent portion, return loss is generated in a high frequency signal. In light of this, in this embodiment, it is possible to reduce the return loss of the high frequency signal in the coil 40 and to improve the Q value of the coil 40.

Second Embodiment

Hereinafter, a second embodiment will be described.

In this embodiment, the same constituent elements as those in the above embodiment are denoted by the same reference signs, and some or all of the descriptions thereof may be omitted in some cases.

Figure 6:
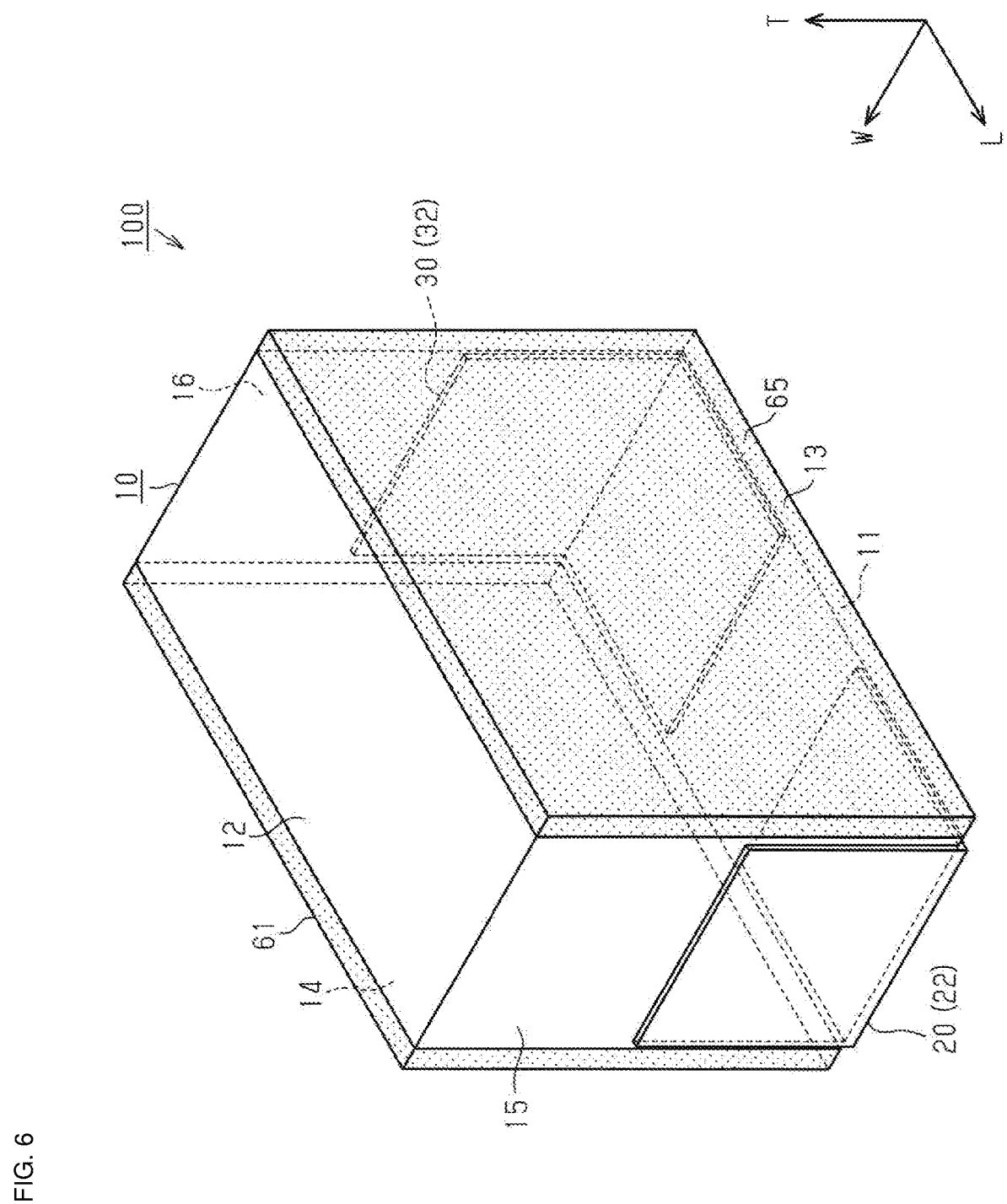
FIG. 6 is a schematic perspective view of an electronic component according to a second embodiment.

As illustrated in FIG. 6, an electronic component 100 includes an element body 10. The element body 10 is formed in a generally rectangular parallelepiped shape. The element body 10 has a mounting surface 11. This mounting surface 11 means a surface opposing a circuit board when the electronic component 100 is mounted on the circuit board. The element body 10 has an upper surface 12 parallel to the mounting surface 11. Further, the element body 10 has two pairs of surfaces orthogonal to the mounting surface 11. One of the two pairs of surfaces is defined as a first side surface 13 and a second side surface 14, and the other one of the two pairs of surfaces is defined as a first end surface 15 and a second end surface 16.

Figure 7A:
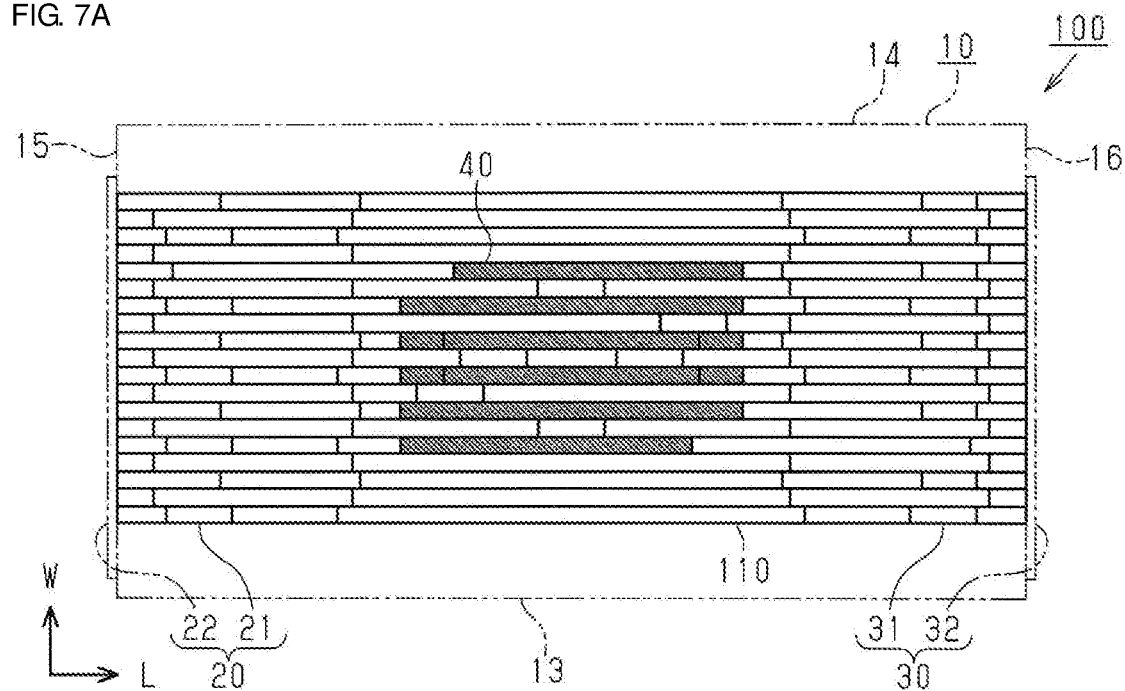
FIG. 7A is a schematic plan view of the electronic component according to the second embodiment.
Figure 7B:
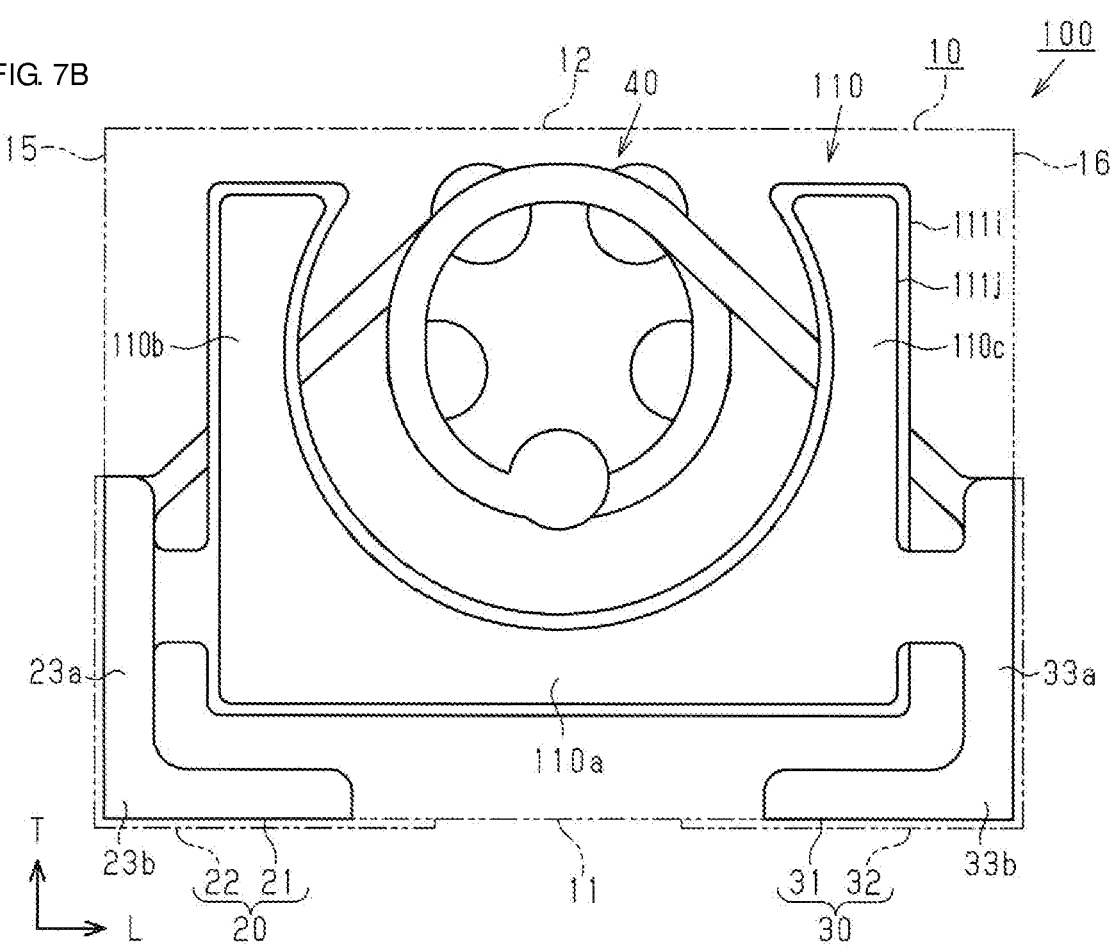
FIG. 7B is a schematic front view of the electronic component according to the second embodiment.
Figure 8:
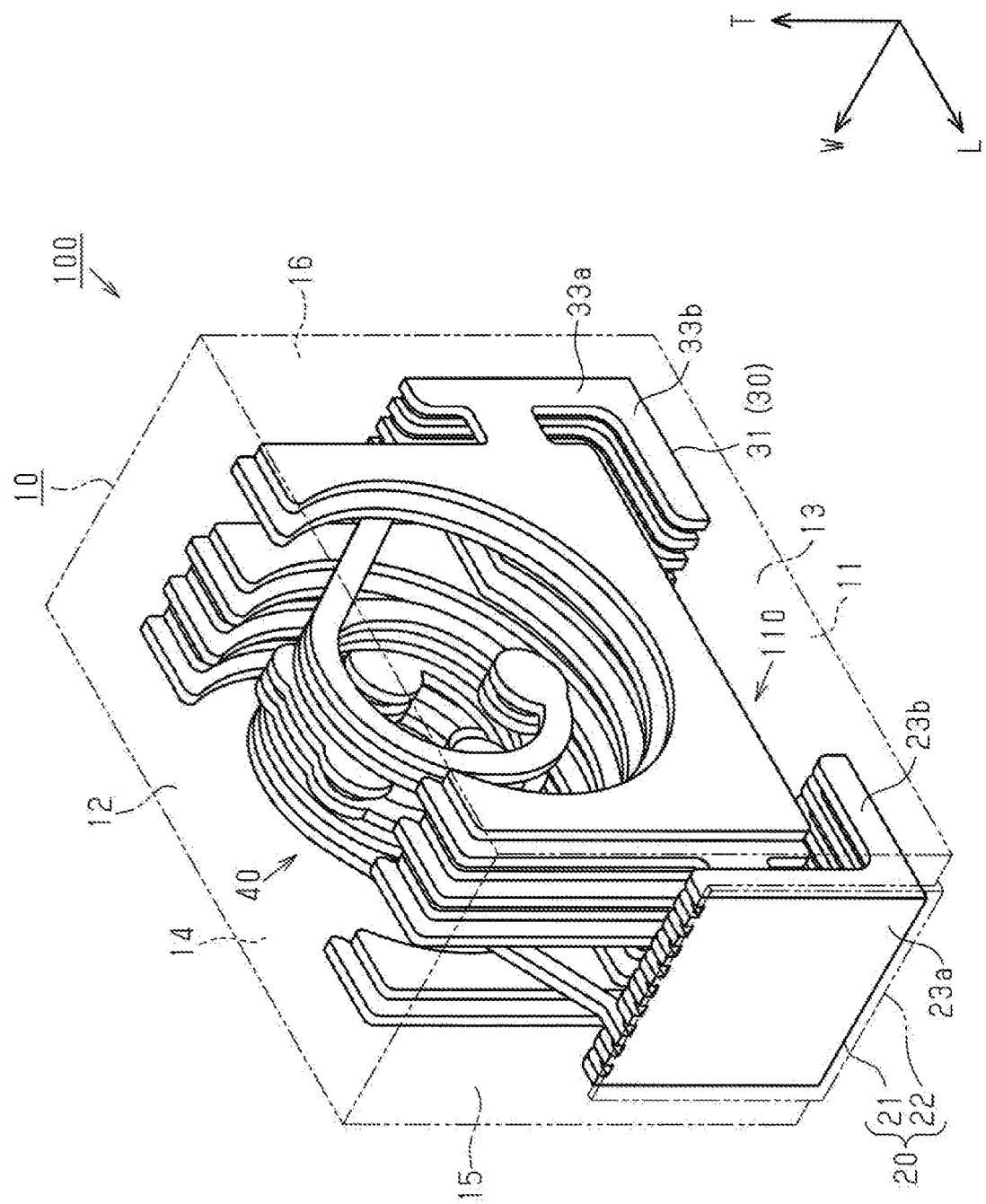
FIG. 8 is a schematic perspective view of the electronic component according to the second embodiment.

As illustrated in FIG. 7A, FIG. 7B, and FIG. 8, the electronic component 100 of the present embodiment includes first and second outer electrodes 20 and 30, a coil 40, and a capacitor 110. Note that, in FIG. 7A, since the coil 40 and the capacitor 110 overlap with each other, a coil conductor layer of the coil 40 is hatched so as to be easily distinguished from the capacitor 110.

A first end of the coil 40 is connected to the first outer electrode 20, and a second end of the coil 40 is connected to the second outer electrode 30. The capacitor 110 is connected in parallel to the coil 40. The coil 40 and the capacitor 110 constitute an LC parallel resonator. The electronic component 100 is electrically connected to a circuit board (not illustrated) via the first and second outer electrodes 20 and 30 interposed therebetween.

Figure 9:
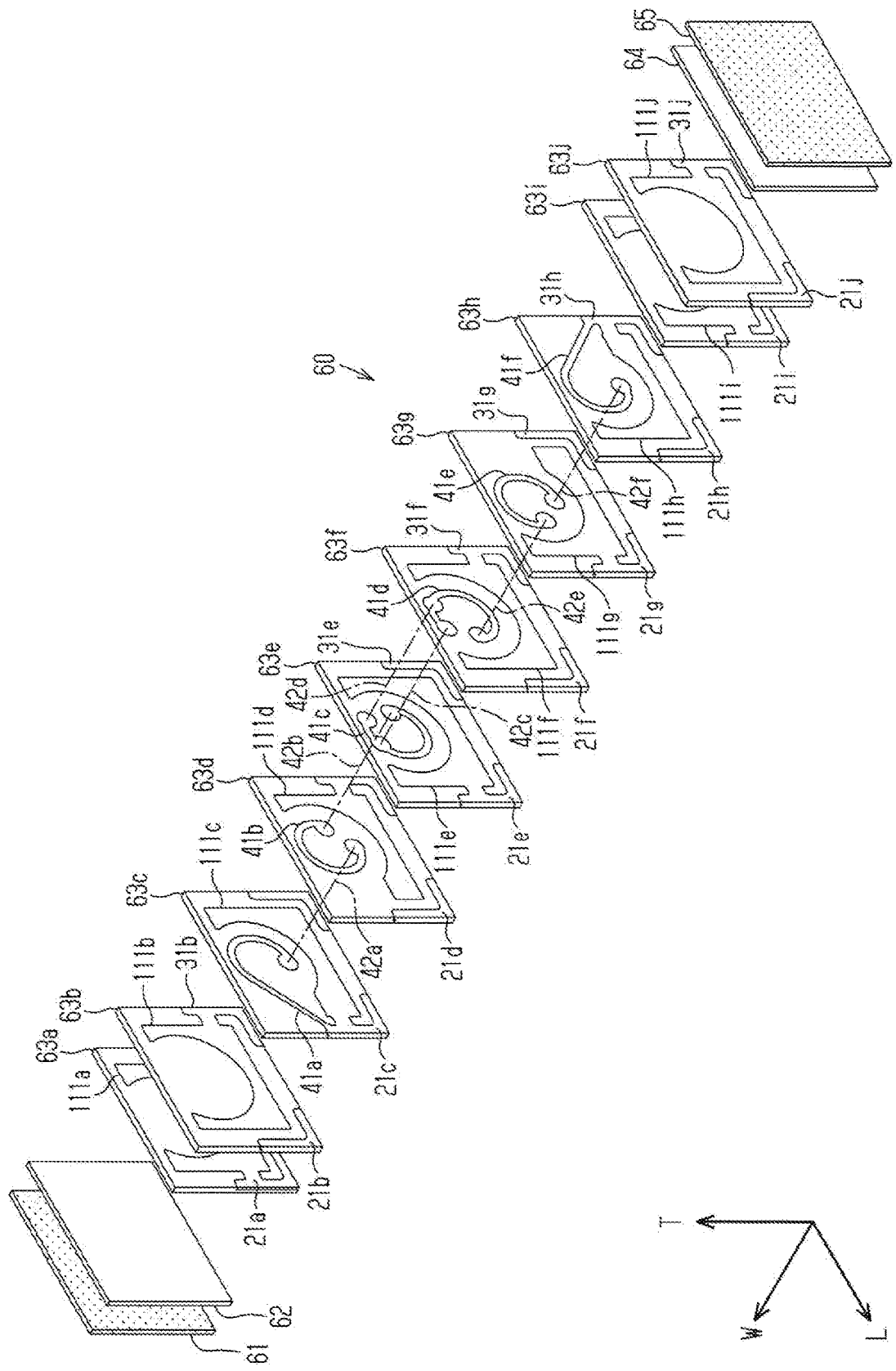
FIG. 9 is an exploded perspective view of the electronic component according to the second embodiment.

As illustrated in FIG. 9, the element body 10 includes a plurality of insulator layers 60. The element body 10 is formed by laminating the plurality of insulator layers 60. The insulator layers are assigned reference signs "61, 62, 63a to 63j, 64, and 65", respectively, for being distinguished from one another. In the following description, a reference sign "60" is used when the plurality of insulator layers are not distinguished, and a separate reference sign such as the reference sign "61" is used when each of the plurality of insulator layers is distinguished from each other.

As illustrated in FIG. 7B, the capacitor 110 is provided between at least the mounting surface 11 of the element body 10 and the coil 40. In this embodiment, the capacitor 110 is provided at a location between the mounting surface 11 of the element body and the coil 40, between the first end surface 15 and the coil 40, and between the second end surface 16 and the coil 40.

The capacitor 110 includes a first capacitance portion 110a provided between the mounting surface 11 of the element body 10 and the coil 40, a second capacitance portion 110b provided between the first end surface 15 of the element body 10 and the coil 40, and a third capacitance portion 110c provided between the second end surface 16 of the element body 10 and the coil 40. Thus, the capacitor 110 does not overlap with a spiral portion of the coil 40. Therefore, since the capacitor 110 does not block the magnetic flux generated by the coil 40, the efficiency of obtaining the inductance value (L value) of the coil 40 can be improved, and the decrease in the Q value of the coil 40 can be suppressed.

As illustrated in FIG. 9, the capacitor 110 includes capacitor conductor layers 111a to 111j formed in a substantially planar shape on insulator layers 63a to 63j, respectively.

On the insulator layer 63a, the capacitor conductor layer 111a is connected to an outer conductor layer 21a. The capacitor conductor layer 111a has a shape in which part of a rectangle is cut out by a circle. The cutout portion corresponds to a spiral portion of the coil 40. In other words, the capacitor conductor layer 111a does not overlap with the spiral portion of the coil 40 in the lamination direction (the width direction W of the element body 10).

On the insulator layer 63b, the capacitor conductor layer 111b is connected to an outer conductor layer 31b. The capacitor conductor layer 111b is formed in the same manner as the capacitor conductor layer 111a. Accordingly, the capacitor conductor layer 111b does not overlap with the spiral portion of the coil 40 in the lamination direction (the width direction W of the element body 10).

On the insulator layer 63c, the capacitor conductor layer 111c is connected to an outer conductor layer 21c. The capacitor conductor layer 111c is formed in a substantially L shape extending along two sides across a corner portion where an outer conductor layer 31c is formed. On the insulator layer 63d, the capacitor conductor layer 111d is connected to an outer conductor layer 31d. The capacitor conductor layer 111d is formed in the same manner as the capacitor conductor layer 111c.

On the insulator layers 63e and 63f, the capacitor conductor layer 111e is connected to an outer conductor layer 21e, and the capacitor conductor layer 111f is connected to an outer conductor layer 31f. The capacitor conductor layers 111e and 111f are formed in the same manner as the capacitor conductor layers 111a and 111b. Accordingly, the capacitor conductor layers 111e and 111f do not overlap with the spiral portion of the coil 40 in the lamination direction (the width direction W of the element body 10).

On the insulator layer 63g, the capacitor conductor layer 111g is connected to an outer conductor layer 21g. The capacitor conductor layer 111g is formed in a substantially L shape extending along two sides across a corner portion where the outer conductor layer 21g is formed. On the insulator layer 63h, the capacitor conductor layer 111h is connected to an outer conductor layer 31h. The capacitor conductor layer 111h is formed in the same manner as the capacitor conductor layer 111g.

On the insulator layers 63i and 63j, the capacitor conductor layer 111i is connected to an outer conductor layer 21i, and the capacitor conductor layer 111j is connected to an outer conductor layer 31j. The capacitor conductor layers 111i and 111j are formed in the same manner as the capacitor conductor layers 111a and 111b. Accordingly, the capacitor conductor layers 111i and 111j do not overlap with the spiral portion of the coil 40 in the lamination direction (the width direction W of the element body 10).

Each of the capacitor conductor layers 111a to 111j is formed of a conductive material such as a metal with low electric resistance like silver (Ag), copper (Cu) or gold (Au), or an alloy containing these metals as a main ingredient, for example.

As illustrated in FIG. 7B, the capacitor conductor layer 111i is formed larger than the capacitor conductor layer 111j. The capacitor conductor layers 111i and 111j are both arranged so that the entire capacitor conductor layer 111j overlaps the capacitor conductor layer 111i when viewed from a direction perpendicular to the first side surface 13 and the second side surface 14 of the element body 10. The same applies to the capacitor conductor layers 111g, 111e, 111c and 111a, and the capacitor conductor layers 111h, 111f, 111d and 111b, as illustrated in FIG. 9.

In FIG. 7B, even if a relative shift in position occurs between the position of the capacitor conductor layer 111i and the position of the capacitor conductor layer 111j, an area where the capacitor conductor layers 111i and 111j oppose each other does not vary. Accordingly, it is possible to suppress a variation in capacitance of the capacitor 110 with respect to the relative shift in position generated during the manufacturing process or the like.

Comparative Example

Figure 10:
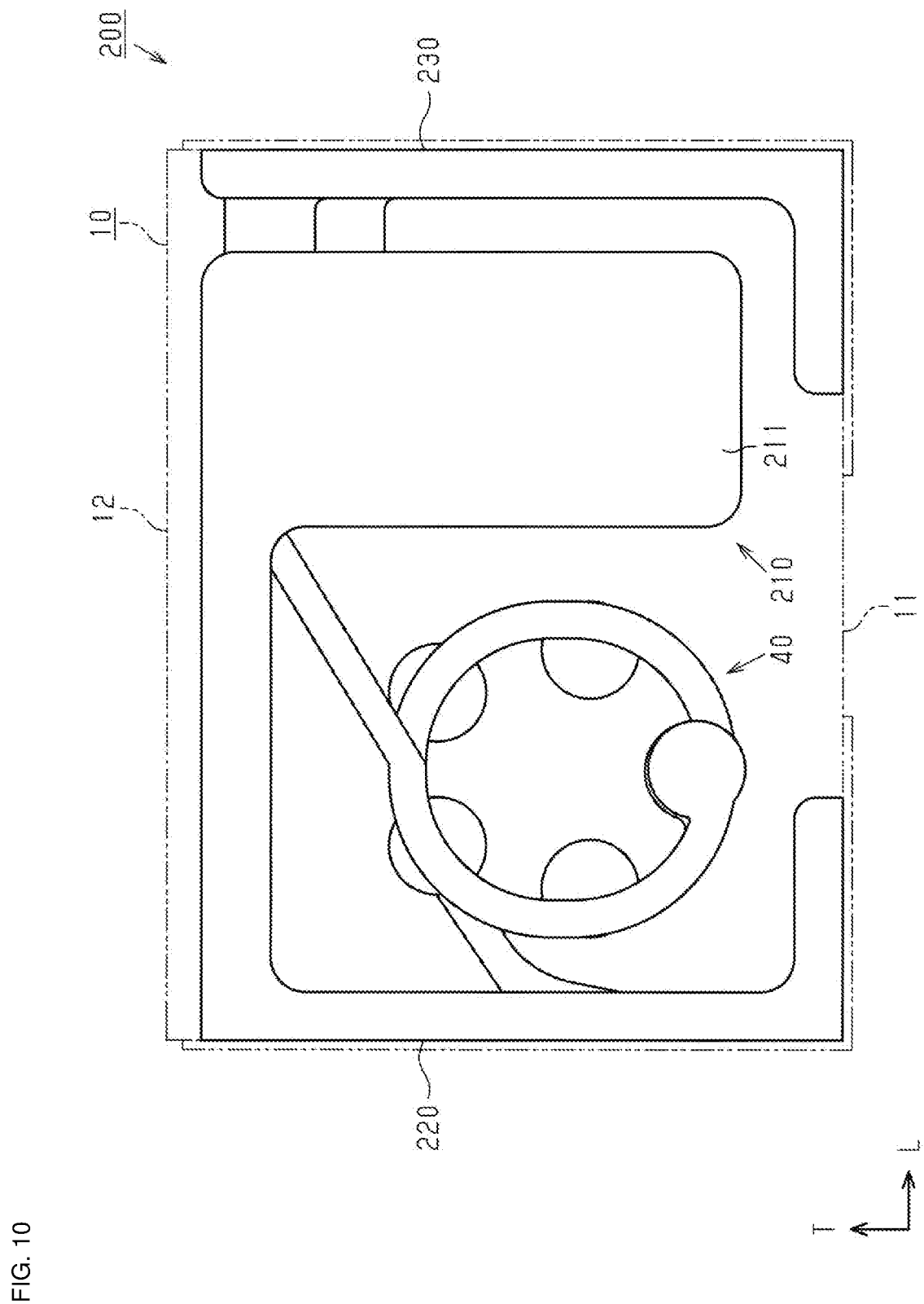
FIG. 10 is a schematic front view of the electronic component according to a comparative example.
Figure 11:
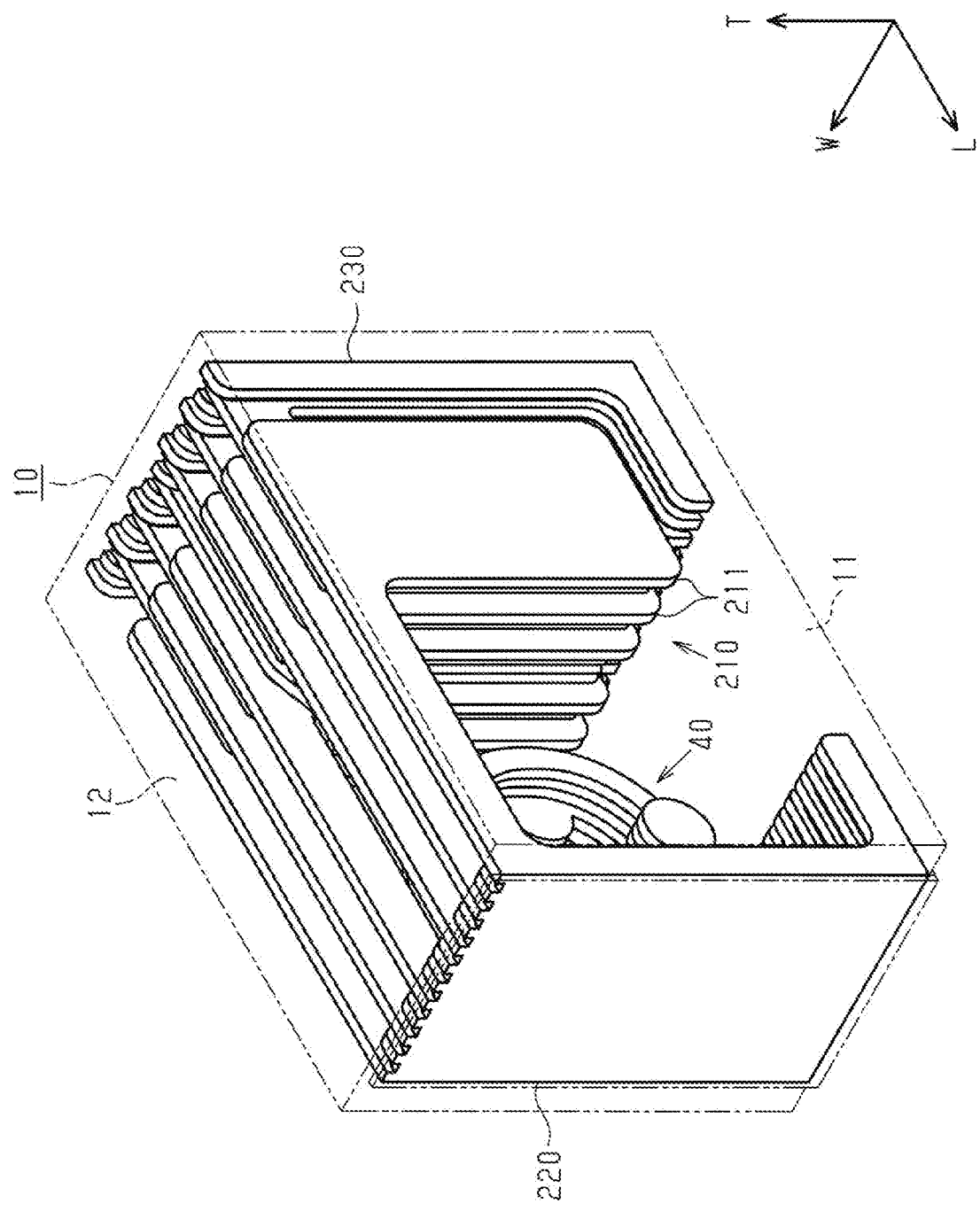
FIG. 11 is a schematic perspective view of the electronic component according to the comparative example.

FIG. 10 and FIG. 11 illustrate an electronic component 200 of a comparative example.

A coil 40 and a capacitor 210 provided in an element body 10 of the electronic component 200 are arranged so as to be aligned in the lengthwise direction L. A first outer electrode 220 and a second outer electrode 230 are formed so as to extend up to an upper surface 12 of the element body 10. The capacitor 210 includes a plurality of capacitor conductor layers 211 provided in the width direction W of the element body 10. One of the capacitor conductor layers 211 adjacent to each other in the arrangement direction is connected to the upper end of the first outer electrode 220, and the other of the capacitor conductor layers 211 adjacent to each other in the arrangement direction is connected to the upper end of the second outer electrode 230.

In this electronic component 200, the coil 40 is lower in position than the upper ends of the first outer electrode 20 and the second outer electrode 30 and is located near a mounting surface 11 of the element body 10. Accordingly, in this electronic component 200, the magnetic flux generated by the coil 40 is blocked by the circuit board on which the electronic component 200 is mounted. Therefore, the Q value of the coil 40 decreases.

Action

In the electronic component 100 of the present embodiment, as in the case of the first embodiment, an intermediate point PC of the coil 40 is offset toward an upper surface 12 side of the element body 10 relative to a position corresponding to about half a height dimension T1 of the element body 10. Therefore, the magnetic flux generated by the coil 40 is unlikely to be blocked by ground wiring, pads, or the like of the circuit board on which the electronic component 100 is mounted. Because of this, decreases in the inductance value (L value), Q value, and the like of the coil 40 are suppressed.

As described above, according to the present embodiment, the following effects can be obtained.

(2-1) Similar to the first embodiment, decreases in the inductance value (L value), Q value, and the like of the coil 40 can be suppressed.

(2-2) The intermediate point PC of the coil 40 is offset toward the upper surface 12 side of the element body 10 relative to a position corresponding to about half the height dimension T1 of the element body 10. The coil 40 is substantially circular in shape. Thus, the capacitor 110 can be disposed at a location between the coil 40 and the mounting surface 11, between the coil 40 and the first end surface 15, and between the coil 40 and the second end surface 16. Therefore, it is possible to provide the electronic component 100 including the capacitor 110 while suppressing a decrease in the Q value of the coil 40.

(2-3) The capacitor 110 includes the first capacitance portion 110a provided between the mounting surface 11 of the element body 10 and the coil 40, the second capacitance portion 110b provided between the first end surface 15 of the element body 10 and the coil 40, and the third capacitance portion 110c provided between the second end surface 16 of the element body 10 and the coil 40. Therefore, it is possible to form the capacitor 110 having a large opposing area. Because of this, it is possible to widen an acquisition range of the capacitance value of the capacitor 110.

(2-4) In the electronic component 100, the coil 40 and the capacitor 110 constitute an LC parallel resonator. The attenuation at a resonant frequency of the LC parallel resonator depends on the Q value of the coil 40. Therefore, by suppressing the decrease in the Q value of the coil 40, the attenuation at the resonant frequency of the LC parallel resonator can be increased.

Third Embodiment

Hereinafter, a third embodiment will be described.

In this embodiment, the same constituent elements as those in the above embodiments are denoted by the same reference signs, and some or all of the descriptions thereof may be omitted in some cases.

Figure 12:
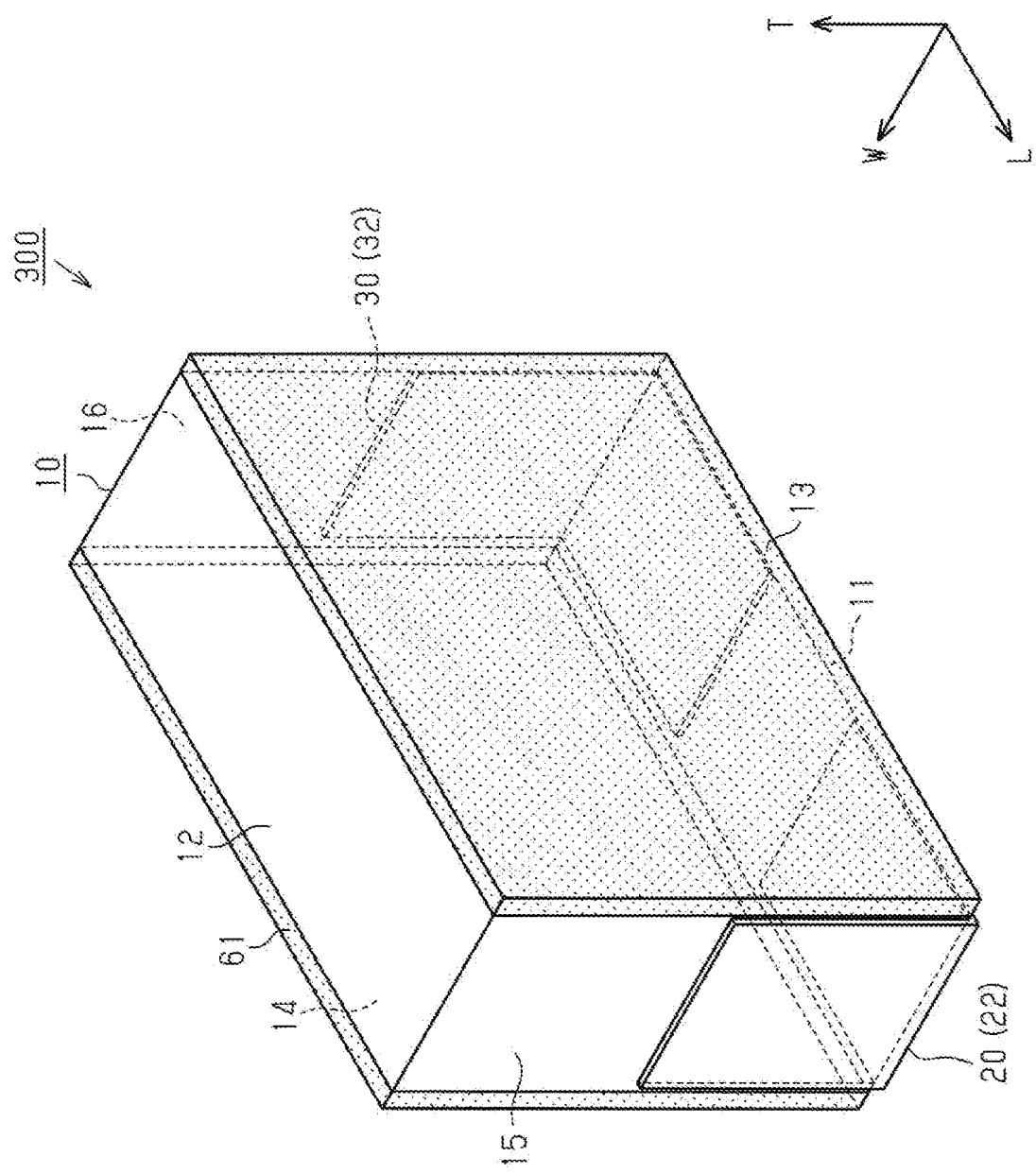
FIG. 12 is a schematic perspective view of an electronic component according to a third embodiment.

As illustrated in FIG. 12, an electronic component 300 includes an element body 10. The element body 10 is formed in a generally rectangular parallelepiped shape. The element body 10 has a mounting surface 11. This mounting surface 11 means a surface opposing a circuit board when the electronic component 300 is mounted on the circuit board. The element body 10 has an upper surface 12 parallel to the mounting surface 11. Further, the element body 10 has two pairs of surfaces orthogonal to the mounting surface 11. One of the two pairs of surfaces is defined as a first side surface 13 and a second side surface 14, and the other one of the two pairs of surfaces is defined as a first end surface 15 and a second end surface 16.

Figure 13A:
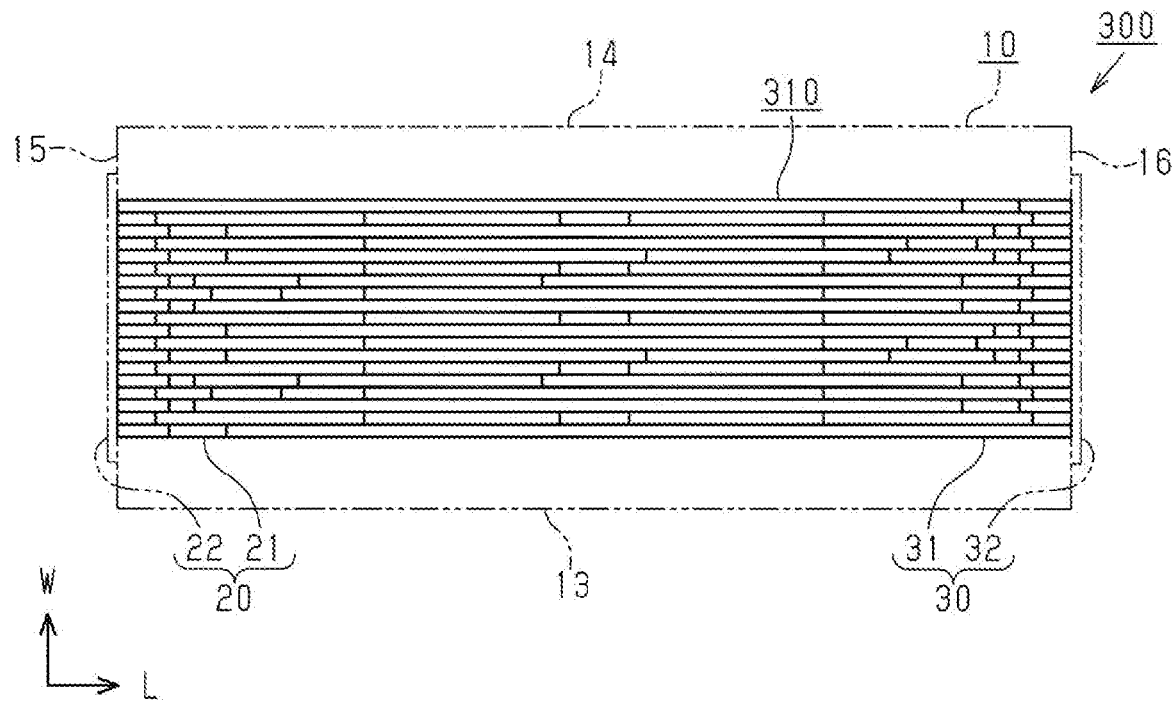
FIG. 13A is a schematic plan view of the electronic component according to the third embodiment.
Figure 13B:
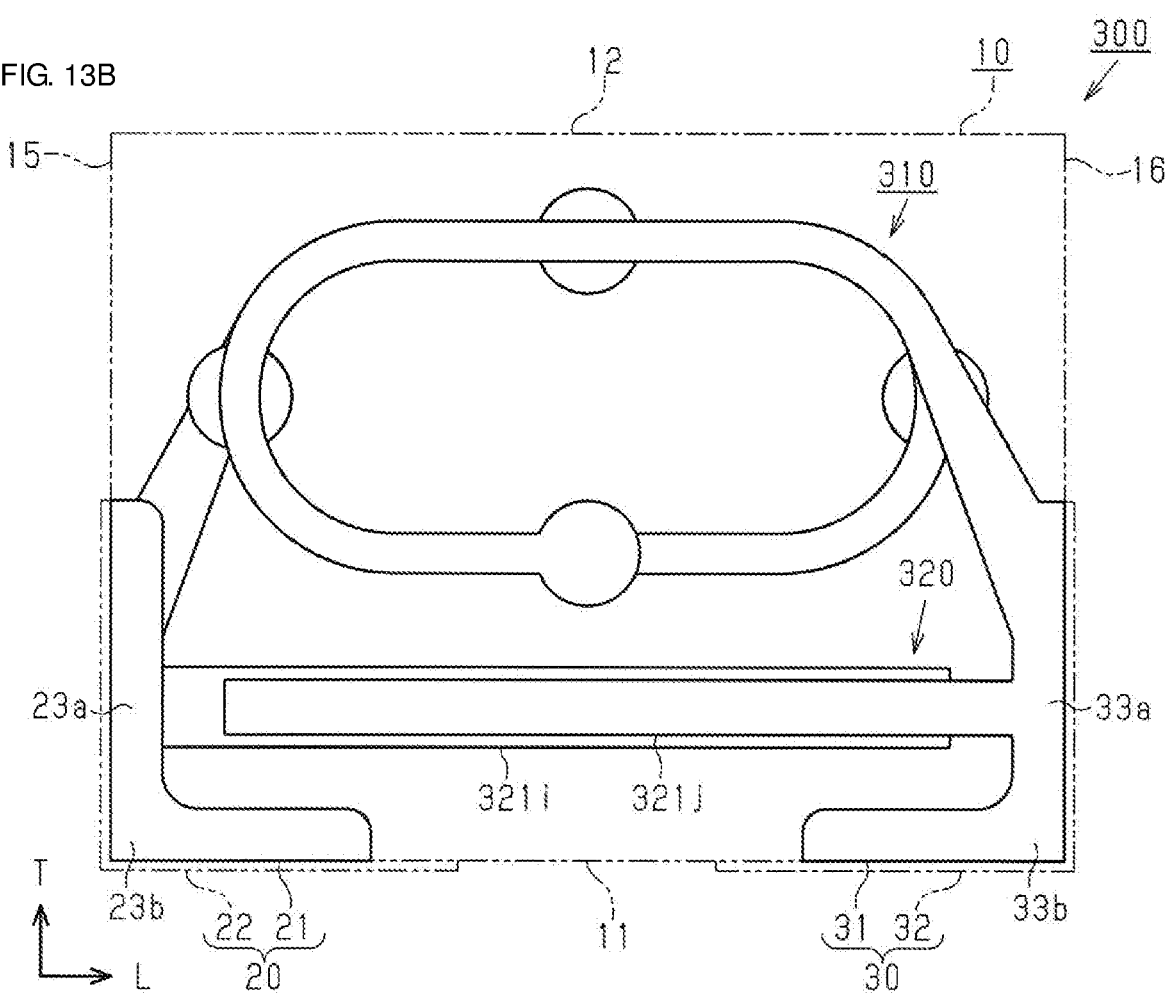
FIG. 13B is a schematic front view of the electronic component according to the third embodiment.
Figure 14:
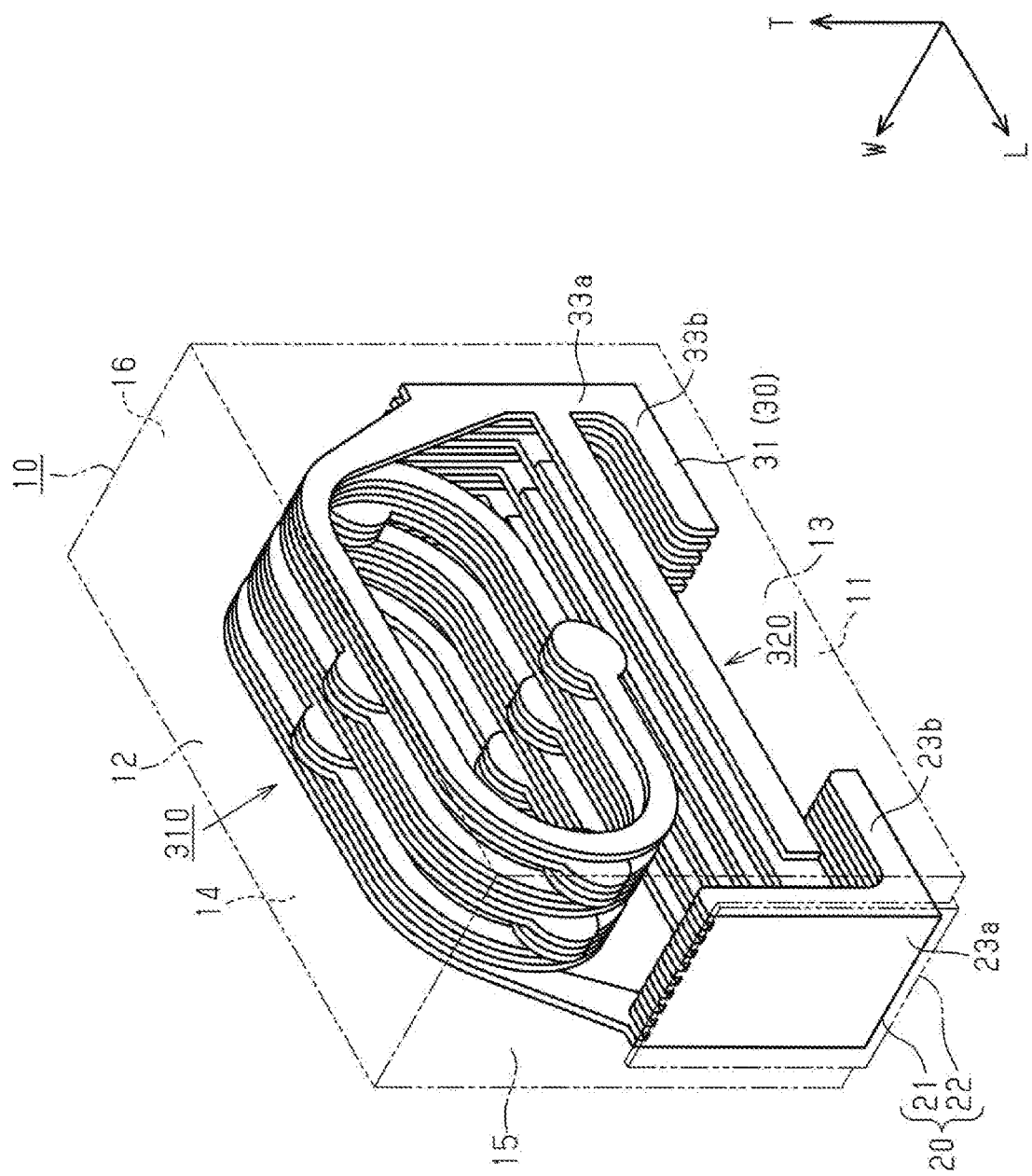
FIG. 14 is a schematic perspective view of the electronic component according to the third embodiment.

As illustrated in FIG. 13A, FIG. 13B, and FIG. 14, the electronic component 300 of the present embodiment includes a coil 310, a capacitor 320, and first and second outer electrodes 20 and 30. A first end of the coil 310 is connected to the first outer electrode 20, and a second end of the coil 310 is connected to the second outer electrode 30. The capacitor 320 is connected in parallel to the coil 310. The coil 310 and the capacitor 320 constitute an LC parallel resonator. The electronic component 300 is electrically connected to a circuit board (not shown) via the first and second outer electrodes 20 and 30.

Figure 15:
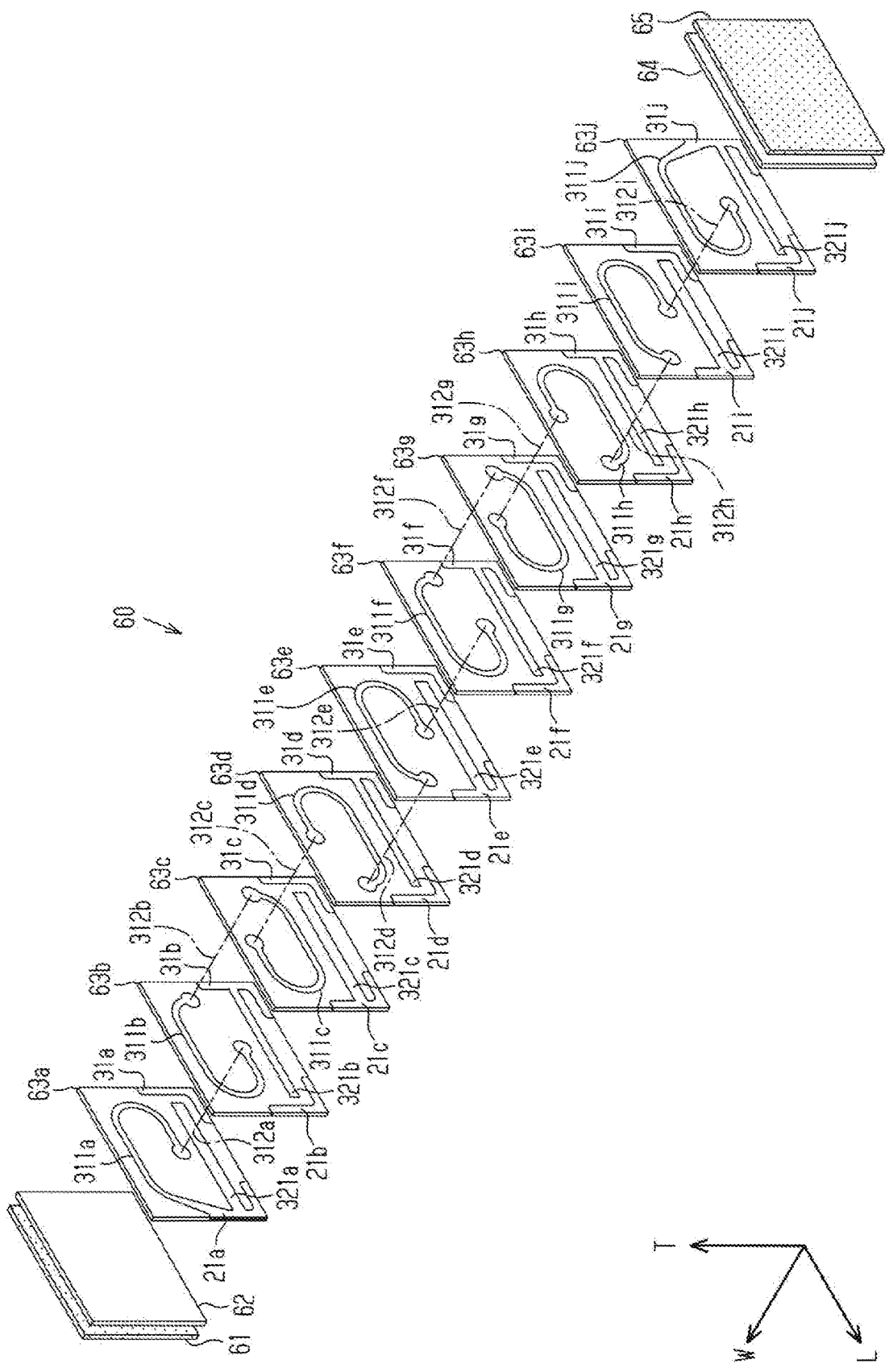
FIG. 15 is an exploded perspective view of the electronic component according to the third embodiment.

As illustrated in FIG. 15, the element body 10 includes a plurality of insulator layers 60. The element body 10 is formed by laminating the plurality of insulator layers 60. The insulator layers are assigned reference signs "61, 62, 63a to 63j, 64, and 65", respectively, for being distinguished from one another. In the following description, a reference sign "60" is used when the plurality of insulator layers are not distinguished, and a separate reference sign such as the reference sign "61" is used when each of the plurality of insulator layers is distinguished from each other.

As illustrated in FIG. 13B, the coil 310 is formed in a substantially oval shape longer in the lengthwise direction L (a right-left direction in FIG. 13B) when viewed from the width direction W (a direction perpendicular to the first side surface 13 and the second side surface 14 illustrated in FIG. 12, and also a direction perpendicular to the drawing of FIG. 13B). The shape of the coil 310 is not limited to the above shape, and the outer shape thereof may be, for example, a substantially oval shape, a substantially rectangular shape, another kind of polygonal shape, a combination of a plurality of shapes, or the like.

The capacitor 320 is provided between the mounting surface 11 of the element body 10 and the coil 310. The capacitor 320 is formed in a substantially rectangular shape extending in the lengthwise direction L (the right-left direction in FIG. 13B) when viewed from the width direction W of the element body 10 (the direction perpendicular to the drawing of FIG. 13B). With this, the capacitor 320 does not overlap with an inner diameter portion of the coil 310. Therefore, since the capacitor 320 does not block the magnetic flux generated by the coil 310, the efficiency of obtaining the inductance value (L value) of the coil 310 can be improved, and the decrease in the Q value of the coil 310 can be suppressed.

As illustrated in FIG. 15, the coil 310 includes coil conductor layers 311a to 311j formed in a substantially planar shape on insulator layers 63a to 63j, and via conductor layers 312a to 312i (indicated by dot-dash lines) for connecting the coil conductor layers 311a to 311j. Thus, the plurality of coil conductor layers 311a to 311j are electrically connected in series with each other and constitute a spiral. As such, the coil 310 is a spiral coil constituted by connecting the coil conductor layers 311a to 311j, the winding number (the number of turns) of each of which is less than one, with the via conductor layers 312a to 312i in series. The coil conductor layers 311a to 311j and the via conductor layers 312a to 312i are each formed of, for example, a conductive material such as a metal with low electric resistance like silver (Ag), copper (Cu) or gold (Au), or an alloy containing these metals as a main ingredient.

The capacitor 320 includes capacitor conductor layers 321a to 321j formed in a substantially planar shape on the insulator layers 63a to 63j, respectively. Each of the capacitor conductor layers 321a to 321j is formed in a substantially rectangular shape on the main surface of each of the insulator layers 63a to 63j. The capacitor conductor layers 321a, 321c, 321e, 321g, and 321i are connected to outer conductor layers 21a, 21c, 21e, 21g, and 21i, respectively. The capacitor conductor layers 321b, 321d, 321f, 321h, and 321j are connected to outer conductor layers 21b, 21d, 21f, 21h, and 21j, respectively. Each of the capacitor conductor layers 321a to 321j is formed of, for example, a conductive material such as a metal with low electric resistance like silver (Ag), copper (Cu) or gold (Au), or an alloy containing these metals as a main ingredient.

As illustrated in FIG. 13B, the capacitor conductor layer 321i is formed larger than the capacitor conductor layer 321j. The capacitor conductor layers 321i and 321j are both arranged so that the entire capacitor conductor layer 321j overlaps the capacitor conductor layer 321i when viewed from a direction perpendicular to the first side surface 13 and the second side surface 14 of the element body 10. The same applies to the capacitor conductor layers 321g, 321e, 321c and 321a, and the capacitor conductor layers 321h, 321f, 321d and 321b, as illustrated in FIG. 15.

In FIG. 13B, even if a relative shift in position occurs between the position of the capacitor conductor layer 321i and the position of the capacitor conductor layer 321j, an area where the capacitor conductor layers 321i and 321j oppose each other does not vary. Accordingly, it is possible to suppress a variation in capacitance of the capacitor 320 with respect to the relative shift in position generated during the manufacturing process or the like.

As described above, according to the present embodiment, the following effects can be obtained.

(3-1) Similar to the first embodiment, decreases in the inductance value (L value), Q value, and the like of the coil 310 can be suppressed.

(3-2) The coil 310 is formed in a substantially oval shape longer in the lengthwise direction L. With this, the return loss is reduced, and it is possible to suppress the decrease in the Q value of the coil 310.

(3-3) The coil 310 includes the coil conductor layers 311a to 311j. Thus, the length of the coil 310 can be increased. Accordingly, an acquisition range of the inductance value (L value) of the coil 310 can be widened.

(3-4) The capacitor conductor layers 321a to 321j are located closer to the mounting surface 11 side than to the uppermost ends of the first outer electrode 20 and the second outer electrode 30, that is, located on the lower side. Accordingly, by the stray capacitance generated between the first and second outer electrodes 20 and 30 and the capacitor conductor layers 321a to 321j, the efficiency of obtaining the capacitance value of the capacitor can be improved.

The above embodiments may be implemented in the following manner.

In each of the above embodiments, the number of insulator layers, coil conductor layers, capacitor conductor layers, or outer conductor layers may be changed as appropriate.

For example, in the first embodiment, coil conductor layers may be formed on the insulator layers 63b and 63i illustrated in FIG. 4. Coil conductor layers may be formed on the insulator layers 63a, 63b, 63i, and 63j. Similarly, in the second embodiment, coil conductor layers may be appropriately formed on the insulator layers 63a, 63b, 63i, and 63j. By doing so, the length of the coil can be increased in the element body in which the insulator layers 60 of the same number are laminated, thereby making it possible to increase the inductance value (L value). In other words, in an electronic component including an element body of the same size, it is possible to widen the acquisition range of the L value.

In addition, in the second embodiment, the capacitor conductor layers 111a and 111j of the insulator layers 63a and 63j may be omitted. Further, the capacitor conductor layers 111a, 111b, 111i, and 111j of the insulator layers 63a, 63b, 63i, and 63j may be omitted. Likewise, in the third embodiment, the capacitor conductor layers 321a to 321j may be omitted as appropriate.

In the third embodiment, the electronic component may include only the coil 310.

In each of the above embodiments, the outer terminal electrode 21 of the first outer electrode 20 and the outer terminal electrode 31 of the second outer electrode 30 are embedded in the element body 10, but may be provided outside the element body 10.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
   a first outer electrode and a second outer electrode that have a substantially L shape and are configured to connect to a circuit board;
   an element body that has a substantially rectangular parallelepiped shape and has a mounting surface to which the first outer electrode and the second outer electrode are exposed, a first end surface which is orthogonal to the mounting surface and to which the first outer electrode is exposed, a second end surface which is parallel to the first end surface and to which the second outer electrode is exposed, and a first side surface and a second side surface that are parallel to each other and are orthogonal to the mounting surface, the first end surface, and the second end surface;
   a coil that has a substantially spiral shape and is provided in the element body where a first end of the coil is connected to the first outer electrode and a second end of the coil is connected to the second outer electrode, and said coil includes a plurality of coil conductor layers connected in series and arranged in a first direction perpendicular to the first side surface and the second side surface; and
   a capacitor that is connected in parallel to the coil, and at least part of the capacitor is provided between the coil and the mounting surface, wherein
   in an inner circumference of the coil, an intermediate point between a lowest point closest to the mounting surface and an uppermost point farthest from the mounting surface is offset from a center of the element body in a second direction perpendicular to the mounting surface toward an opposite side to the mounting surface, and
   the coil is in a substantially oval shape extending in a direction perpendicular to the first end surface and the second end face when viewed from the first side surface, and
   the capacitor has a substantially rectangular shape extending in the direction perpendicular to the first end surface and the second end surface when viewed from the first side surface.

2. The electronic component according to claim 1, wherein
   the capacitor includes a plurality of capacitor conductor layers arranged in the first direction and opposing each other in the first direction.

3. The electronic component according to claim 2, wherein
   each of the first outer electrode and the second outer electrode has an outer terminal electrode embedded in the element body.

4. The electronic component according to claim 1, wherein
   the capacitor includes a first capacitance portion provided between the coil and the mounting surface, a second capacitance portion provided between the coil and the first end surface, and a third capacitance portion provided between the coil and the second end surface.

5. The electronic component according to claim 1, wherein
   each of the first outer electrode and the second outer electrode has an outer terminal electrode embedded in the element body.

6. The electronic component according to claim 1, wherein
   the intermediate point is located on a side opposite to the mounting surface relative to an upper end of each of the first outer electrode and the second outer electrode.

7. The electronic component according to claim 1, wherein
   the capacitor is located closer to the mounting surface side than to an upper end of each of the first outer electrode and the second outer electrode.

8. The electronic component according to claim 1, wherein
   where a dimension of the element body in a direction perpendicular to the mounting surface is taken as a height dimension T1 and a distance from the mounting surface to the intermediate point is taken as a height D1, a ratio D1/T1, which is a ratio of the height D1 to the height dimension T1, satisfies a range of $0.51 \leq D1/T1 \leq 0.71$.

* * * * *